(12) United States Patent
Mallavarpu et al.

(10) Patent No.: US 6,266,629 B1
(45) Date of Patent: Jul. 24, 2001

(54) LARGE SIGNAL MODEL FOR A PSEUDOMORPHIC HETEROJUNCTION ELECTRON MOBILITY TRANSISTOR

(75) Inventors: Raghuveer Mallavarpu, Boxborough; Douglas A. Teeter, Arlington, both of MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/182,378

(22) Filed: Oct. 29, 1998

(51) Int. Cl.[7] .................................................. G06G 7/62
(52) U.S. Cl. .................. 703/13; 703/2; 703/14; 716/3
(58) Field of Search .................. 703/2, 13, 14, 703/19; 716/3, 5, 6

(56) References Cited

U.S. PATENT DOCUMENTS 5,452,225 * 9/1995 Hammer .................................. 703/19
5,467,291 * 11/1995 Fan et al. ................................ 703/14

OTHER PUBLICATIONS

Cojocaru et al., "Improved Prediction of the Intermodulation Distortion Characteristics of MESFETs and PHEMTs via a Robust Nonlinear Device Model", IEEE MTT–S International Microwave Symposium, vol. 2, pp. 749–752, Jun. 1998.*

Teeter et al., "Prediction of HBT ACPR Using the Gummel Poon Large Signal Model", Technical Digest 19th Annual Gallium Arsenide Integrated Circuit Symposium, pp. 41–44, Oct. 1997.*

Madjar, A., "A Fully Analytical AC Large–Signal Model of the GaAs MESFET Nonlinear Network Analysis and Design", IEEE Trans. on Microwave Theory and Techniques, vol. 36, Issue 1, pp. 61–67, Jan. 1988.*

(List continued on next page.)

*Primary Examiner*—Kevin J. Teska
*Assistant Examiner*—Douglas W. Sergent
(74) *Attorney, Agent, or Firm*—Daly, Crowley & Mofford, LLP

(57) ABSTRACT

A method is provided for large signal modeling of a field effect transistor. The method includes establishing a small signal model for the transistor, such model having a gate-source capacitance $C_{gs}$ and a drain-gate capacitance $C_{dg}$, both being functions of a gate-source voltage $V_{gs}$ and a drain-source voltage $V_{ds}$. The s-parameters of the transistor are measured and curve fitting is applied to the measured s-parameters to establish small signal model parameters. The small signal model parameters include gate-source capacitance $C_{gs}$ as a function of $V_{gs}$ and $V_{ds}$ and gate-drain capacitance $C_{dg}$ as a function of $V_{gs}$ and $V_{ds}$. Curve fitting is applied to $C_{gs}$ and $C_{dg}$ to establish large signal gate charge fitting parameters. The established large signal gate charge fitting parameters are used to express a gate-source charge $Q_{gs}$ and a gate-drain charge $Q_{gd}$ as functions of $V_{gs}$ and a gate-drain voltage $V_{gd}$ in a large signal model for the transistor.

14 Claims, 21 Drawing Sheets

OTHER PUBLICATIONS

Teeter et al., "Comparison of Hybrid PI and TEE HBT Circuit Topologies and Their Relationship to Large Signal Modeling", IEEE MTT–S Inter. Microwave Symp. Digest, vol. 2, pp. 375–378, Jun. 1997.*

Ferrero et al., Novel Hardware and Software Solutions for a Complete Linear and Nonlinear Microwave Device Characterization, IEEE Trans. on Instr. and Measurement, vol. 43, Issue 2, pp. 299–305, 4/94.*

Sung, et al., "Extraction of High–Frequency Equivalent Circuit Parameters from Submicron Gate–Length MOSFETs", IEEE Trans. on Electron Devices, vol. 45, Issue 8, pp. 1769–1775, Aug. 1998.*

Winson et al., "Applications of a Generalized Dirichlet Principle to Transistor Modeling", Proc. IEEE Southeastcon '96, pp. 425–427, Apr. 1996.*

Angelov, I. et al., "A New Empirical Nonlinear Model for HEMT and MESFET Devices", IEEE Transactions On Microwave Theory and Techniques, vol. 40, No. 12, pp. 2258–2266 (1992).

Cojocaru, V. et al., "Improved Prediction of the Intermodulation Distortion Characteristics of MESFETs and PHEMTs Via Robust Nonlinear Device Model", IEEE MTT–S Digest, 0–7803–4471–5, pp. 749–752 (1998).

Curtice, W. et al., "A Nonlinear GaAs FET Model for Use in the Design of Output Circiuts for Power Amplifiers", IEEE Transactions On Microwave Theory and Techniques, vol. MTT–33 No. 12, pp. 1383–1393 (1985).

Mallavarpu, R. et al., "The Importance of Gate Charge Formulation In Large–Signal PHEMT Modeling", IEEE, 0–7803–5049–9, pp. 87–90 (1998).

Materka, A. et al., "Computer Calculation of Large–Signal GaAs FET Amplifier Characteristics", IEEE Transactions On Microwave Theory and Techniques, vol. MTT–33, No. 2, pp. 129–135 (1985).

Osorio, R. et al., "Analytical Charge Conservative Large Signal Model For Modfets Validated Up To MM–Wave Range", IEEE MTT–S Digest, 0–7803–4471–5, pp. 595–598 (1998).

Qu, G. et al., "Validation Of A New Nonlinear HEMT Model By Intermodulation Characterization", IEEE MTT–S Digest, 0–7803–4471–5, pp. 745–748 (1998).

Root, D. et al., "Priciples Of Nonlinear Active Device Modeling For Circuit Simulation", Presented at the 32nd ARFTG Conference, pp. 1–22 (1998).

Statz, H. et al., "GaAs FET Device and Circuit Simulation in SPICE", IEEE Transactions On Electron Devices, vol. ED–34, No. 2, pp. 160–169 (1987).

Struble, W. et al., "A New Small Signal MESFET and HEMT Model Compatible With Large Signal Modeling", IEEE MTT–S Digest, CH3389–4/94/0000–1567, pp. 1567–1570 (1994).

Ward, D. et al., "A Charge–Oriented Model for MOS Transistor Capacitances", IEEE Journal Of Solid–State Circuits, vol. SC–13, No. 5, pp. 703–708 (1978).

Wei, Ce–Jun et al., "An Accurate Large–Signal Model of GaAs MESFET Which Accounts for Charge Conservation, Dispersion, and Self–Heating", IEEE Transactions On Microwave Theory and Techniques, vol. 46, No. 11, pp. 1638–1644 (1998).

* cited by examiner

FIGURE 5

- MODEL FILE = 060670m090.mod          DATA FILE = 060670m090.dmb
- (S) IN = 1213rf_96.in                (S) OUT = 1213rf_96.out
- INPUT BOND = 107.00pH                OUTPUT BOND = 63.00pH
- INPUT CAP  = 0.0000pF                OUTPUT CAP = 0.0000pF

- PROCESS LINE    RESEARCH        DATE           18-JUN-97 12:43:28
- LOT NUMBER      96686-03        OPERATOR       P. BUHLES
- MASK NAME       PA149-96        MASK NUMBER    1213RF
- CHIP NUMBER     06-06           JIG NUMBER     2405
- DEVICE/CIRCUIT  12X100          PERIPHERY (mm) 1.200000
- TEMPERATURE (C) AMB.            BIAS CODE

- S11ERR=1.47 S21ERR=1.65 S12ERR=2.12 S22ERR=2.93 KERR=7.72 MAGERR=1.21

|   | Vds | Ids | Vgs | Ig | Ggs | Gdg | Rg | Rs | Rd | Ri |
|---|---|---|---|---|---|---|---|---|---|---|
|   | (volts) | (mA) | (volts) | (mA) | (mS) | (mS) | (Ohms) | (Ohms) | (Ohms) | (Ohms) |
|   | 7.000 | 14.35 | -0.901 | -0.026 | 0.000 | 0.036 | 0.360 | 0.320 | 0.550 | 1.497 |
|   | Gm | T1 | Gds | T2 | Cgs | Cds | Cdg | C11 | Ls | C22 |
|   | (mS) | (pS) | (mS) | (pS) | (pF) | (pF) | (pF) | (pF) | (pH) | (pF) |
|   | 91.69 | 3.52 | 5.327 | 1.05 | 0.9029 | 0.2846 | 0.1644 | 0.0007 | 20.00 | 0.0015 |

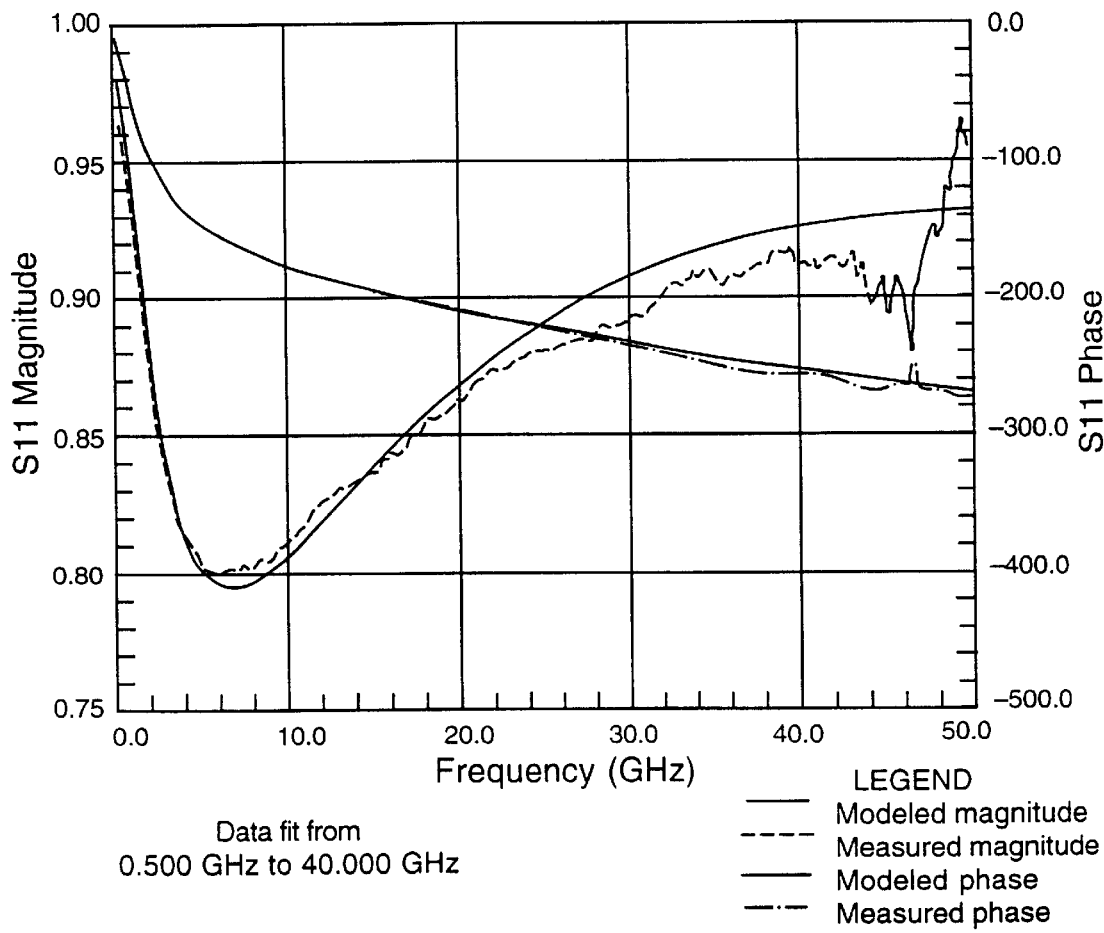

Data fit from
0.500 GHz to 40.000 GHz

LEGEND
——— Modeled magnitude
- - - - Measured magnitude
——— Modeled phase
—·— Measured phase

FIGURE 6B

- PROCESS LINE        RESEARCH              ACCUTEST CODE    N/A
- LOT NUMBER          96686-03              MASK NUMBER
- MASK NAME           PA149-96              JIG NUMBER       2405
- CHIP NUMBER         06-06                 PERIPHERY (mm)   1.2MM
- DEVICE/CIRCUIT      12X100                CODE             N/A
- TEMPERATURE (C)     ROOM
- DRAIN                                     GATE
- VOLTAGE (V)    CURRENT (ma)      VOLTAGE (V)    CURRENT (ma)
-    +6.96         +104.8             -0.46           +0.00

MODEL = MATERKA

IDSS    2.4519E-01    (AMPS)
VPO    -7.0269E-01    (VOLTS)
GAMA   -8.3224E-02
E       1.7510E+00
KE     -6.4341E-01
SL      7.4975E-01    (S)
KG     -6.3446E-01
SS      5.2237E-03    (S)

RG =   0.360
RS =   0.320
RD =   0.550
RI =   1.412

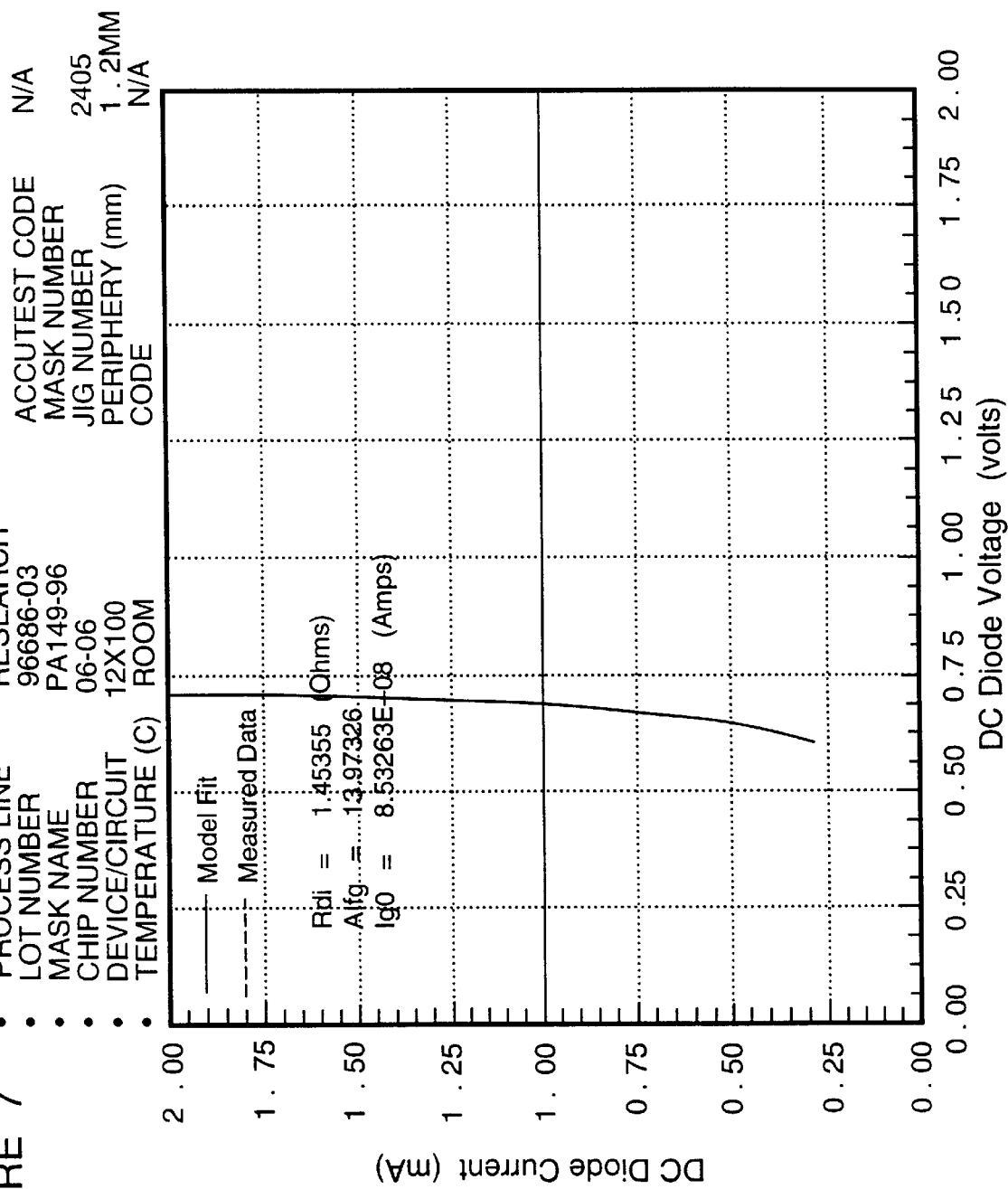

FIGURE 8B

- PROCESS LINE         RESEARCH
- LOT NUMBER           96686-03
- MASK NAME            PA149-96
- CHIP NUMBER          06-06
- DEVICE/CIRCUIT       12X100

ACCUTEST CODE    N/A
MASK NUMBER
JIG NUMBER       2405
PERIPHERY (mm)   1.2MM

MODEL = IBR

GMAX     1.3172E-02
VBR     -1.4658E+01     (S)
K1       1.3855E-01    (VOLTS)
K2      -9.0899E+00
K3       1.6160E+00    (VOLTS)

RG =  0.360
RS =  0.320
RD =  0.550
RI =  1.412

LARGE SIGNAL MODEL FOR A PSEUDOMORPHIC HETEROJUNCTION ELECTRON MOBILITY TRANSISTOR

STATEMENT REGARDING FEDERALLY SPONSORED RESEARCH

The government has certain rights in the invention pursuant to Contract No. MDA972-96-3-0001, awarded by the Defense Advanced Research Projects Agency.

BACKGROUND OF THE INVENTION

This invention relates generally to Pseudomorphic Heterojunction Electron Mobility Transistors (PHEMTs) and more particularly to methods for modeling such transistors.

As is known in the art, PHEMTs are used in power amplifiers and low noise amplifiers in a wide range of military and commercial applications. Because of its high efficiency operation, high gain (even near pinch-off) and low noise figure, the PHEMT has replaced the MESFET in radar and communication applications for frequencies ranging from S-Band through mm-wave. The excellent performance of the device, however, is not backed by adequate large signal models essential in MMIC power amplifier design to accurately predict output power, power added efficiency (PAE), harmonic power, third order intermodulation distortion, and adjacent channel power ratio.

Traditionally, the model formulations developed for the MESFET have been adapted to the PHEMT with mixed results, based on the frequency of operation. The error in this approach has been that one of the most critical model parameters; namely, the gate charge has been modeled with simplistic formulations. As a result, the input capacitance nonlinearities have been inadequately modeled, resulting in inaccurate large signal prediction of fundamental quantities such as power and efficiency with even larger discrepancies in harmonic power and 3rd order intermodulation distortion. Recent papers such as: "Analytical Charge Conservative Large Signal Model for MODFETs Validated up to mm-Wave Range" by R. Osorio, M. Berroth, W. Marsetz, L. Verweyen, M. Demmler, H. Massler, M. Neumann, and M. Schlechtweg, published in the IEEE MTT-S Digest, pp.595, 1998; and "Improved Prediction of the Intermodulation Distortion Characteristics of MESFETs and PHEMTs Via a Robust Nonlinear Device Model", by V. I.Cojocaru and T. J. Brazil, published in IEEE MTT-S Digest, pp.749, 1998, have used more complex expressions for the gate charge with excellent results, but the model verification has been limited to small periphery devices, generally less than 400 $\mu$m.

SUMMARY OF THE INVENTION

In accordance with the present invention, a method is provided for large signal modeling of a field effect transistor. The method includes establishing a small signal model for the transistor, such model having a gate-source capacitance $C_{gs}$ and a drain-gate capacitance $C_{dg}$, both being functions of a gate-source voltage $V_{gs}$ and a drain-source voltage $V_{ds}$. The s-parameters of the transistor are measured and curve fitting is applied to the measured s-parameters to establish small signal model parameters. The small signal model parameters include gate-source capacitance $C_{gs}$ as a function of $V_{gs}$ and $V_{ds}$ and gate-drain capacitance $C_{dg}$ as a function of $V_{gs}$ and $V_{ds}$. Curve fitting is applied to $C_{gs}$ and $C_{dg}$ to establish large signal gate charge fitting parameters. The established large signal gate charge fitting parameters are used to express a gate-source charge $Q_{gs}$ and a gate-drain charge $Q_{gd}$ as functions of $V_{gs}$ and a gate-drain voltage $V_{gd}$ in a large signal model for the transistor.

A two terminal voltage dependent gate charge expression $Q_g = f(V_{gs}, V_{gd}) = Q_{gs} + Q_{gd}$ has been obtained that describes PHEMT gate capacitances $C_{gs}$ and $C_{dg}$, where $C_{gs}$ represents capacitance between the gate and the source of the transistor; $C_{dg}$ represents capacitance between the gate and drain of the transistor; $V_{gs}$ represents voltage between the gate and the source of the transistor; and, $V_{gd}$ represents voltage between the gate and the drain of the transistor. More particularly the equation for $Q_g$ is expressed as:

$$Q_g = \left[\frac{(C_{110} - C_{11th})}{2} f(V_{j1}) + C_{11th}(V_{j1} - V_{cgs})\right][1 + \lambda(V_0 - V_{ds0})] - C_{12sat}V_{j2}$$

where: $C_{110}$, $C_{11th}$, $V_{cgs}$, $\lambda$, $V_{ds0}$ and $C_{12sat}$ are gate charge fitting parameters;

$f(V_{j1}) = V_{j1} - V_{cgs} + (1/A_{cgs})\ln(\cosh(A_{cgs}*(V_{j1}-V_{cgs})));$ $V_{j1} = \gamma_2*((1+\alpha)*V_{gs} - V_{ds} + \beta(V_{ds}^2 + \delta_{ds}^2)^{0.5});$ $V_{j2} = \gamma_2*((1+\alpha)*V_{gs} - V_{ds} - \beta(V_{ds}^2 + \delta_{ds}^2)^{0.5});$ $V_0 = (V_{ds}^2 + \delta_{ds}^2)^{0.5};$ and $A_{cgs}$, $\gamma_2$, $\alpha$, $\beta$, and $\delta_{ds}$ are gate charge fitting parameters.

The gate capacitances $C_{gs}$ and $C_{dg}$ are functions of two terminal voltages $V_{gs}$ and $V_{gd}$, and are obtained by taking the derivatives of $Q_g$, as follows:

$C_{gs} = \delta Q_g / \delta V_{gs}$ $C_{dg} = \delta Q_g / \delta V_{gd}$ $C_{gs} = \delta Q_g / \delta V_{gs} = C_1*(1+\lambda*(V_0-V_{ds0}))*\gamma_2*(\alpha+\beta*V_{ds}/V_0) + C_2*\lambda*V_{ds}/V_0 - \gamma_2*C_{12sat}*(\alpha-\beta*V_{ds}/V_0);$ $C_{dg} = \delta Q_g / \delta V_{gd} = C_1*(1+\lambda*(V_0-V_{ds0}))*\gamma_2*(1-\beta*V_{ds}/V_0 - C_2*\lambda*V_{ds}/V_0) + V_0\gamma_2*C_{12sat}*(1+\beta*V_{ds}/V_0);$ where:

$C_1 = ((C_{110}-C_{11th})/2)*(1+\tanh(A_{cgs}*(V_{j1}-V_{cgs}))) + C_{11th}$ $C_2 = ((C_{110}-C_{11th})/2)*f(V_{j1}) + C_{11th}*(V_{j1}-Vcgs).$ Note that the voltage between the drain and source, $V_{ds}$, is related to the two voltages $V_{gs}$ and $V_{gd}$ described above by the relation:

$V_{ds} = V_{gs} - V_{gd}$

With such model, prediction of critical large signal parameters, namely: Output power, PAE, drain current, harmonic power and 3rd order Inter-Modulation Distortion (IMD), are provided with improved accuracy.

In accordance with another aspect of the invention, a method for determining large signal model values for a transistor includes obtaining device parameters of the transistor. The obtained device parameters are used to establish small signal model parameters in accordance with a small signal model of the transistor, such parameters including a gate-source capacitance $C_{gs}$ and a gate-drain capacitance $C_{dg}$. Curve fitting is applied to $C_{gs}$ and $C_{dg}$ to establish large signal gate charge fitting parameters. The established large signal gate charge fitting parameters are used to establish a gate-source charge $Q_{gs}$ and a gate-drain charge $Q_{gd}$ as large signal model values for the transistor.

With such method, a more accurate modeling of transistors can be achieved.

In accordance with another aspect of the invention, a computer program product, residing on a computer readable medium, is provided including instructions for causing a computer to obtain measure the s-parameters of a transistor. The program includes instructions to cause the computer to determine small signal device parameters in accordance with a small signal model by curve fitting the measured s-parameters. One of such small signal parameters is a gate-source capacitance $C_{gs}$ which is a function of a gate-source voltage $V_{gs}$ and a drain-source voltage $V_{ds}$, and another one of such small signal parameters being a drain-gate capacitance $C_{ds}$ which is a function of $V_{gs}$ and $V_{ds}$. The program further includes instructions to cause the computer to determine gate charge fitting parameters, in accordance with a curve fitting operation, from $C_{gs}$ and $C_{ds}$ to establish a large signal gate-source charge $Q_{gs}$ and a large signal gate-drain charge $Q_{gd}$.

With such an arrangement, computer modeling of transistors to achieve more accurate expected performance is achievable, which can assist in transistor design.

In accordance with another aspect of the invention, a computer program product, residing on a computer readable medium, includes instructions for causing a computer to obtain device parameters of the transistor. The program can use the obtained device parameters to establish small signal model parameters in accordance with a small signal model of the transistor, such parameters including a gate-source capacitance $C_{gs}$ and a gate-drain capacitance $C_{dg}$. The program can apply curve fitting to $C_{gs}$ and $C_{dg}$ to establish large signal gate charge fitting parameters. The program can use the established large signal gate charge fitting parameters to establish a gate-source charge $Q_{gs}$ and a gate-drain charge $Q_{gd}$ as large signal model values for the transistor.

Embodiments of the invention can provide one or more of the following advantages. A range of PHEMT devices varying in size from 0.2 mm to 2.4 m can be accurately modeled. More accurate prediction of Power, PAE, Harmonics, IMD etc., are achieved. PHEMT I-V characteristics are fit very well.

BRIEF DESCRIPTION OF THE DRAWINGS

These, and other features of the invention, will become more readily apparent from the following detailed description when taken together with the following drawings, in which:

FIG. 5 is a plot of an s-parameter vs. frequency;

FIG. 6B shows fitting parameters for drain-source current $I_{dg}$;

FIG. 7 is a plot of diode current vs. diode voltage;

FIG. 8B shows fitting parameters for breakdown current $I_{br}$;

DESCRIPTION OF PREFERRED EMBODIMENTS

Figure 1:
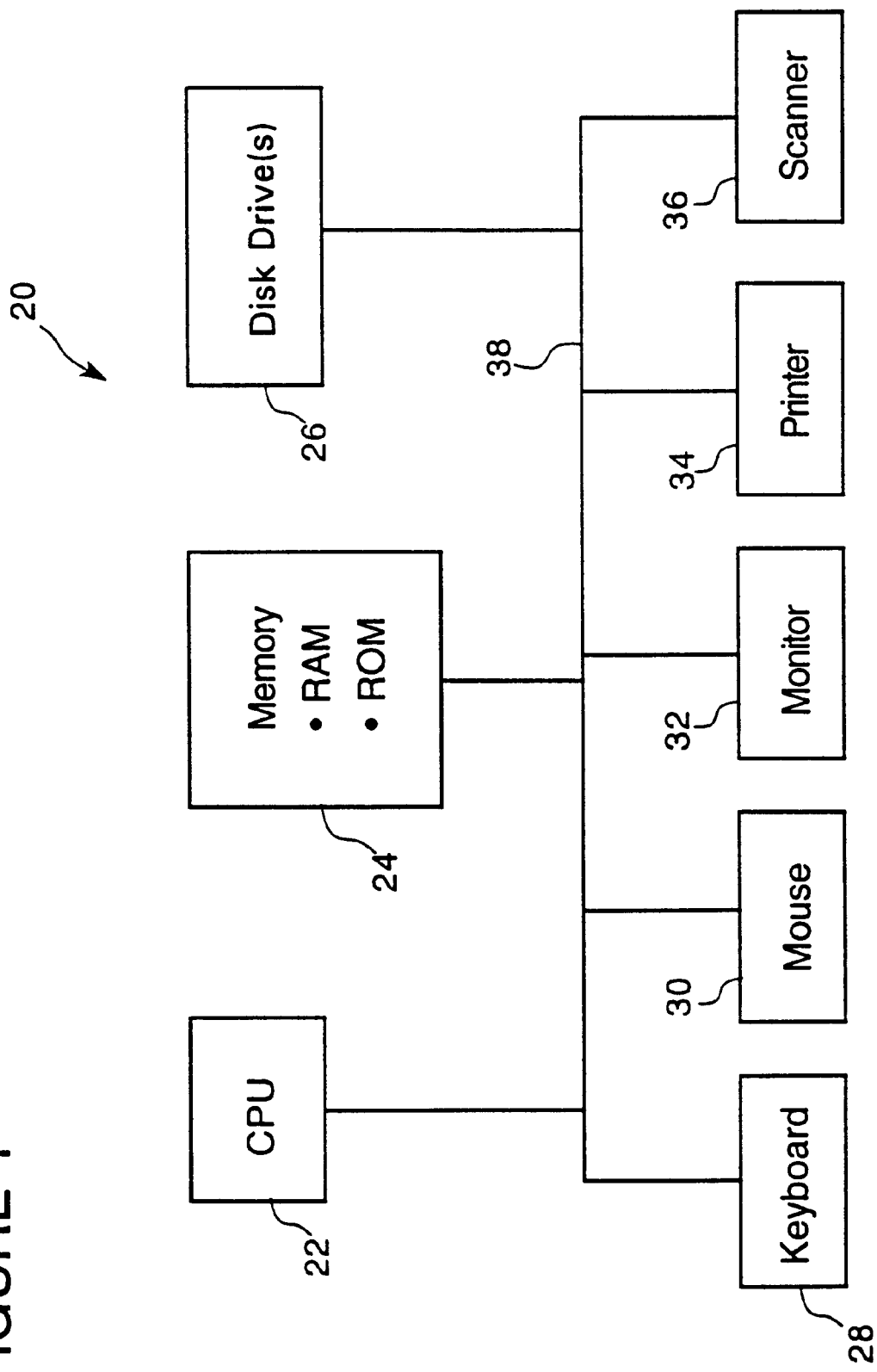
FIG. 1 is a block diagram of a computer system.

As shown in FIG. 1, a computer system 20 includes a central processing unit (CPU) 22, memory 24, one or more disk drives 26, a keyboard 28, a mouse 30, a monitor 32, a printer 34, and a scanner 36, all connected by a bus 38. The memory 24 can be, as indicated, random-access memory (RAM) or read-only memory (ROM). The disk drives 26 can include, e.g., a floppy disk drive, a CD ROM drive, a hard disk drive, and/or a zip drive. The system 20 can implement the invention by, e.g., controlling the CPU 22 with software code stored in the memory 24 and/or on disks in the disk drives 26. The software code can be in any of a variety of computer languages such as FORTRAN, C, or C++. Due to the nature of computer programming, the CPU can be controlled by, e.g., software, hardware, firmware, hardwiring, or combinations of these. The bus 38 can connect through networks, e.g., the Internet.

Figure 2:
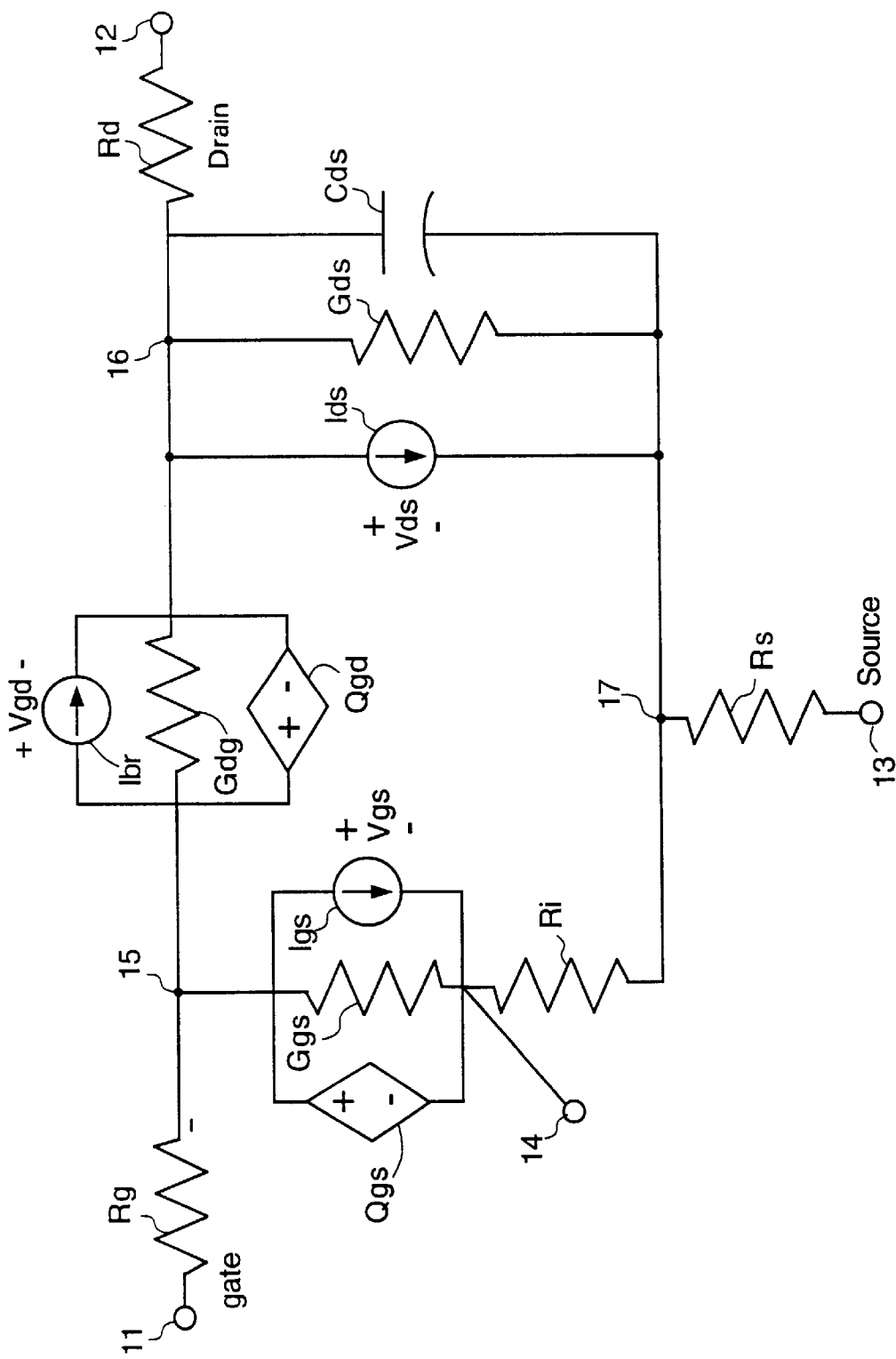
FIG. 2 is circuit diagram of a large signal model of a field effect transistor.

Referring now to FIG. 2, a generalized schematic of the large signal PHEMT model 10 is shown. The gate, drain, and source terminals are designated as 11, 12 and 13, respectively. Thus, the model 10 is a three terminal network. Various nodes 14, 15, and 16, have been indicated. The impedance between nodes 11 and 15 is modeled as a resistance $R_g$. The impedance between nodes 14 and 15 is modeled as a current source $I_{gs}$ in shunt with both conductance $G_{gs}$ and a gate-source charge $Q_{gs}$. Thus, the total current from node 15 to node 14 is the sum of: $I_{gs}$, $V_{gs}G_{gs}$, and $dQ_{gs}/dt$ (i.e., the time rate of change, or derivative, in the charge $Q_{gs}$). The impedance between nodes 15 and 16 is modeled as a current source $I_{br}$ in shunt with both conductance $G_{gd}$ and a gate-drain charge $Q_{gd}$. Thus, the total current from node 15 to node 16 is the sum of: $I_{br}$, $V_{gd}G_{gd}$, and $dQ_{gd}/dt$ (i.e., the time rate of change, or derivative, in the charge $Q_{gd}$). The impedance between nodes 16 and 17 is modeled as a current source $I_{ds}$ in shunt with both conductance $G_{ds}$ and a capacitor $C_{ds}$. Thus, the total current from node 15 to node 16 is the sum of: $I_{ds}$, $V_{ds}G_{ds}$, and $d[C_{ds}V_{ds}]/dt$ (i.e., the time rate of change, or derivative, in $C_{ds}V_{ds}$). The impedance between node 16 and 12 is modeled as a resistance $R_d$. The impedance between nodes 17 and 13 is modeled as a resistance $R_s$. The impedance between nodes 14 and 17 is modeled as a resistance $R_i$.

A summary of parameters used above is presented below:

$R_g$ is the gate resistance;
$R_s$ is the source resistance;
$R_d$ is the drain resistance;
$R_i$ is the intrinsic channel resistance;
$C_{ds}$ is the drain-source capacitance;
$G_{gs}$ is the gate-source conductance;
$G_{dg}$ is the drain-gate conductance;
$G_{ds}$ is the drain-source conductance;
$Q_{gs}$ is the gate-source charge;

$I_{gs}$ is the gate-source current;

$I_{br}$ is the gate-drain breakdown current;

$Q_{gd}$ is the gate-drain charge;

$I_{ds}$ is the drain-source current;

$V_{gs}$ is the gate-source voltage;

$V_{gd}$ is the gate-drain voltage; and $V_{ds}$ is the drain-source voltage.

Figure 3:
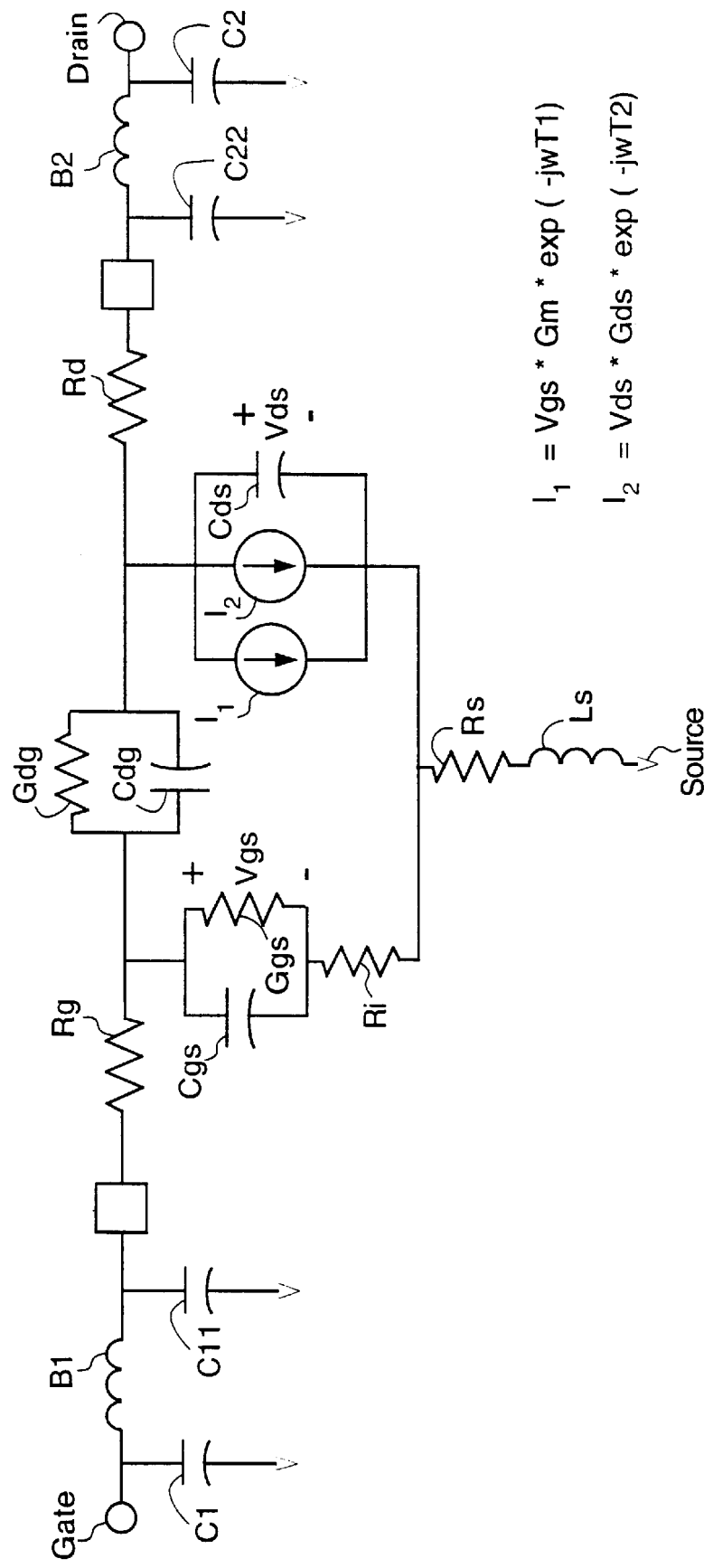
FIG. 3 is a circuit diagram of a small signal model of a field effect transistor.

Referring to FIG. 3, the small signal model for the transistor is shown. Again it is noted that the model is a three terminal network. We will now outline how each element in the model is extracted.

Figure 4:
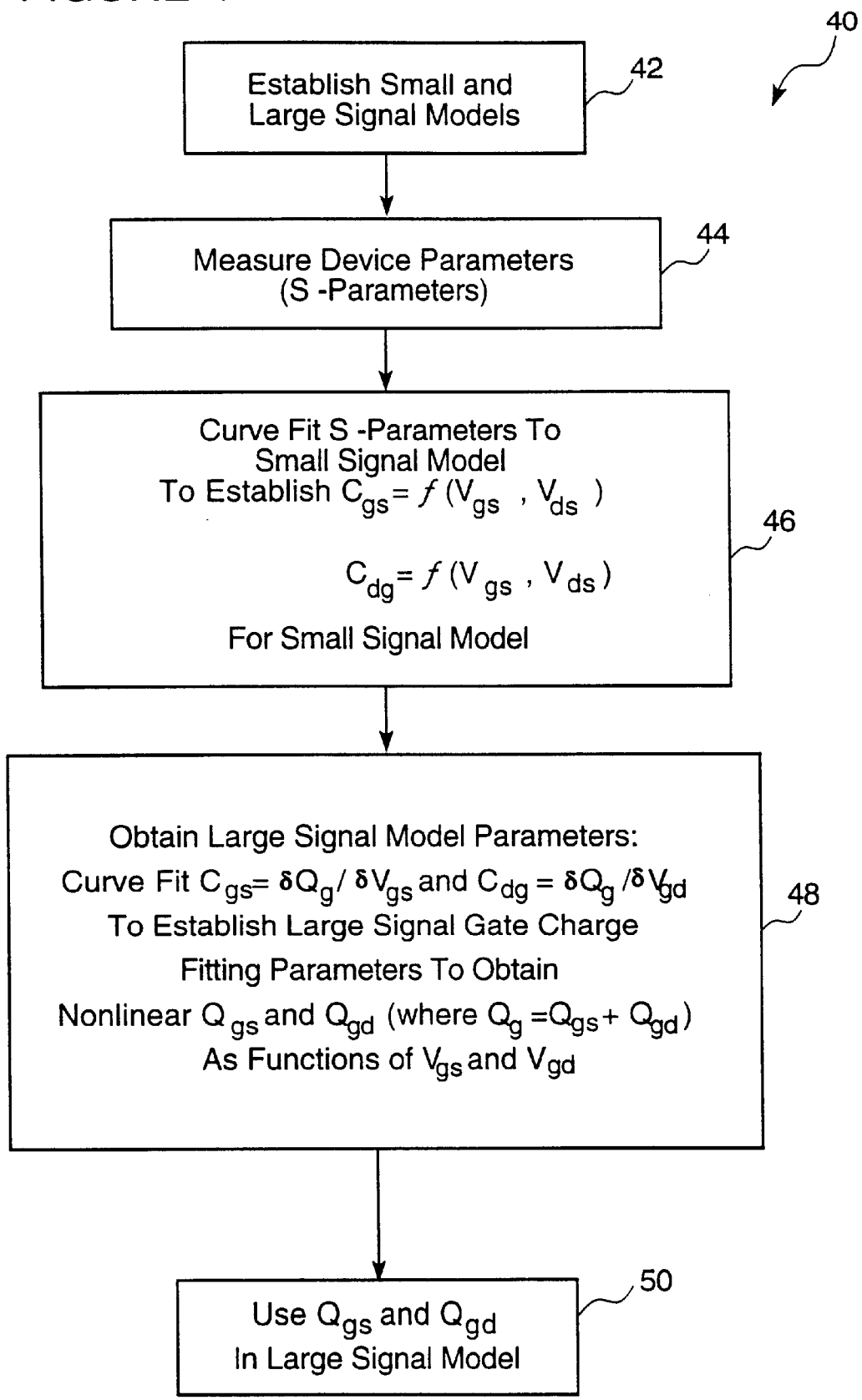
FIG. 4 is a flow diagram for determining parameters of the large signal model shown in FIG. 2.

As shown in FIG. 4, a method 40 of producing and using the large signal PHEMT model 10 begins at step 42 with small and large signal models being established. Here, the circuit topologies for the small and large signal models are determined, but the numerical values or parameters for the elements in these circuits need to be determined. At step 44, device parameters are measured. The gate resistance $R_g$, of the device is measured. Next, conventional S-parameters are measured: $S_{11}$, $S_{12}$, $S_{21}$, $S_{22}$ over the frequency band. A typical $S_{11}$ parameter as a function of frequency is shown in FIG. 3. At step 46, from the measured S-parameters and using curve fitting computer programs, the values of remaining circuit elements in the small signal model shown in FIG. 3 are derived in a conventional manner, where a gate-source capacitance $C_{gs}$ and a drain-gate capacitance $C_{dg}$ are both functions of $V_{ds}$ and $V_{gs}$ and:

$C_1$ is a bond wire extrinsic capacitance $B_1$ is a bond wire extrinsic inductance $C_{11}$ is a extrinsic gate pad capacitance $R_g$ is the gate resistance $G_{gs}$ is the gate-source conductance $R_i$ is the intrinsic channel resistance $G_{dg}$ is the drain-gate conductance $I_1 = V_{gs}*G_m*\exp(-jwT_1)$, where:

$V_{gs}$ is the gate-source voltage;

$G_m$ is the transconductance;

j is the square root of −1;

w is 2 f, where f is frequency; and $T_1$ is channel transit time;

$I_2 = V_{ds}*G_{ds}*\exp(-jwT_2)$, where:

$V_{ds}$ is the drain-source voltage; and $G_{ds}$ is drain-source conductance;

$T_2$ is drain to source transit time;

$R_d$ is drain resistance;

$C_{22}$ is a extrinsic drain pad capacitance;

$B_2$ is a extrinsic output bond wire inductance;

$C_2$ is a extrinsic output bond wire capacitance;

$R_s$ is source resistance; and $L_s$ is source inductance.

The process is performed for various bias conditions. For example, for a range of $V_{ds}$ bias voltages from 0 to 7 volts, for each of a set of fixed $V_{ds}$ values, (e.g., 0 volts, 1 volt, 2 volts, 3 volts, . . . , 7 volts), the voltage $V_{gs}$ is varied. This provides the small signal model parameters.

At step 48 (FIG. 4), the large signal model parameters are obtained using the large signal model 10 shown in FIG. 2. As described below, for nonlinear analysis $C_{gs}$ and $C_{dg}$ are curve fit to establish $Q_{gs}$ and $Q_{gd}$. Some of the large signal model parameters are the same as the small signal model parameters. The following parameters used in model 10 are determined from the small signal model are: $R_g$, the gate resistance; $R_s$, the source resistance; $R_d$, the drain resistance;

$R_i$, the intrinsic channel resistance; $C_{ds}$, the drain-source capacitance; $G_{gs}$, the gate-source conductance; and $G_{dg}$ the drain-gate conductance. The remaining parameters are: $Q_{gs}$, the gate-source charge; $Q_{dg}$, the drain-gate charge; $I_{br}$, the gate-drain breakdown current; $I_{ds}$, the drain-source current; and $I_{gs}$, the gate-source current. For linear analysis, these remaining parameters are easily obtained while for nonlinear analysis more complicated equations are used for $I_{ds}$, $I_{gs}$, and $I_{br}$ and curve fitting of $C_{gs}$ and $C_{dg}$ is used to obtain $Q_{gs}$ and $Q_{gd}$. For example, gradient optimization can be used to curve fit $C_{gs}$ and $C_{dg}$, with the same fitting parameters for each, to obtain $Q_{gs}$ and $Q_{gd}$.

For linear analysis in the active bias region (normal operation):

$I_{gs} = 0$;

$I_{br} = 0$;

$I_{ds} = V_{gs}*G_m\exp(-jwT_1)$;

$Q_{gs}$ is replaced with Cgs; and $Q_{dg}$ is replaced with Cdg.

For non-linear analysis:

$G_{ds} = \delta I_{ds}/\delta V_{ds}$.

Figure 6A:
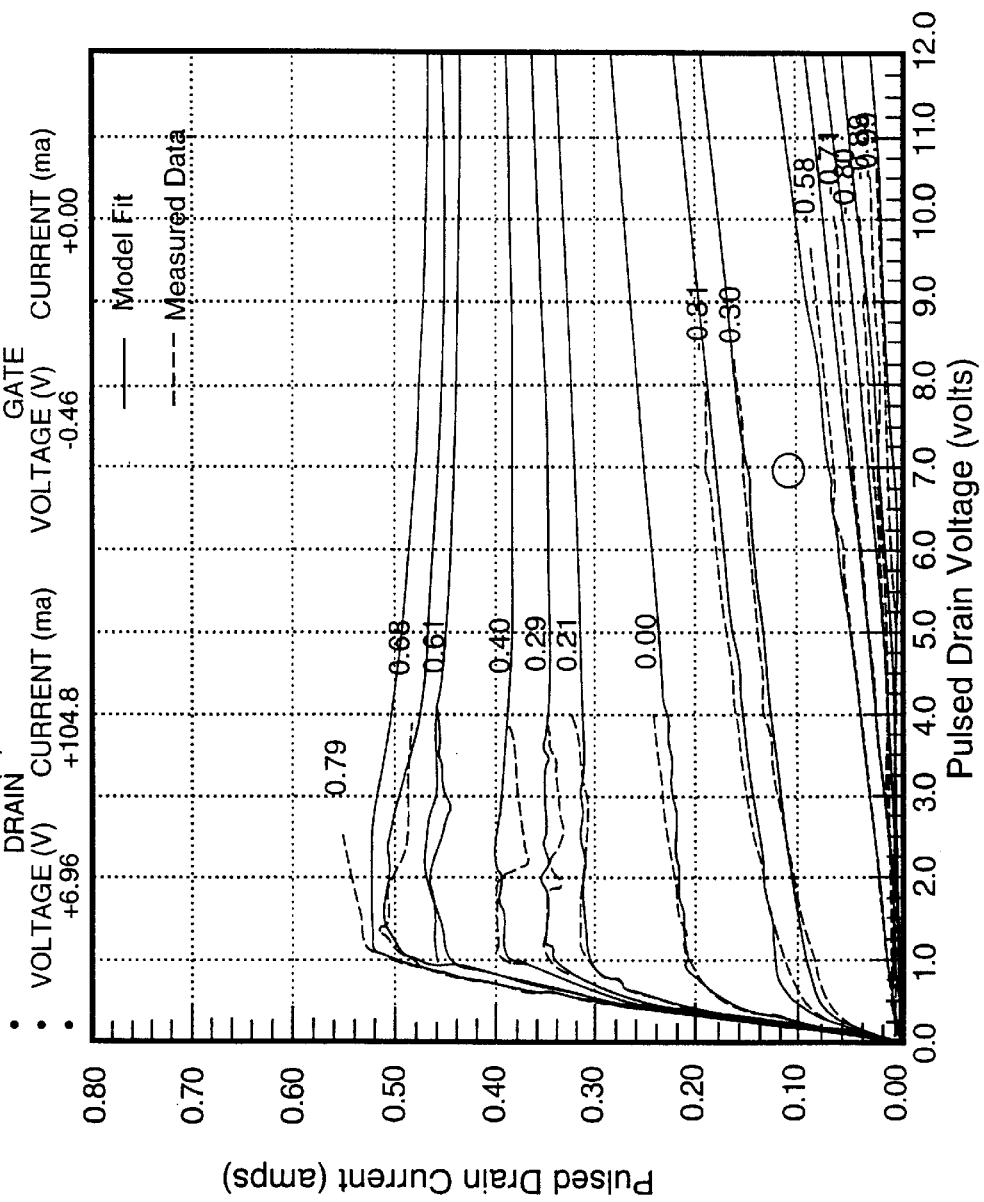
FIG. 6A is a plot of drain current vs. drain voltage.

The parameter: Ids (i.e., the I-V equation) is obtained from a modified form of the Materka equation (described in "Computer Calculation of Large-Signal GaAs FET Amplifier Characteristics", by A. Materka and T. Kacprzak, IEEE Trans. MTT-33, pp. 129, 1985) and is defined as follows:

$$I_{ds} = I_{dss}\left[1 - \left\{\frac{V_{gs}}{(V_{po} + \gamma V_{ds})}\right\}\right]^{(E+K_e V_{gs})} \cdot \tanh\left[\frac{(S_l \cdot V_{ds})}{\{I_{dss}(1 - K_g V_{gs})\}}\right] \cdot \left[1 + \frac{(S_s V_{ds})}{I_{dss}}\right]$$

with $I_{dss}$, $V_{po}$, $\gamma$, E, $K_e$, $S_1$, $S_s$, and $K_g$ being the fitting parameters. The above equation is fitted to measured pulsed I-V characteristics of the device to obtain the fitting parameters, as shown in FIGS. 6A–6B.

The forward gate current is:

$$I_{gs} = I_{g0} \cdot \exp(\alpha_g \cdot V_{gs} - 1)$$

in which $I_{g0}$ and $\alpha_g$ are fitting parameters, which are obtained by fitting to measured device data, as shown in FIG. 7.

Figure 8A:
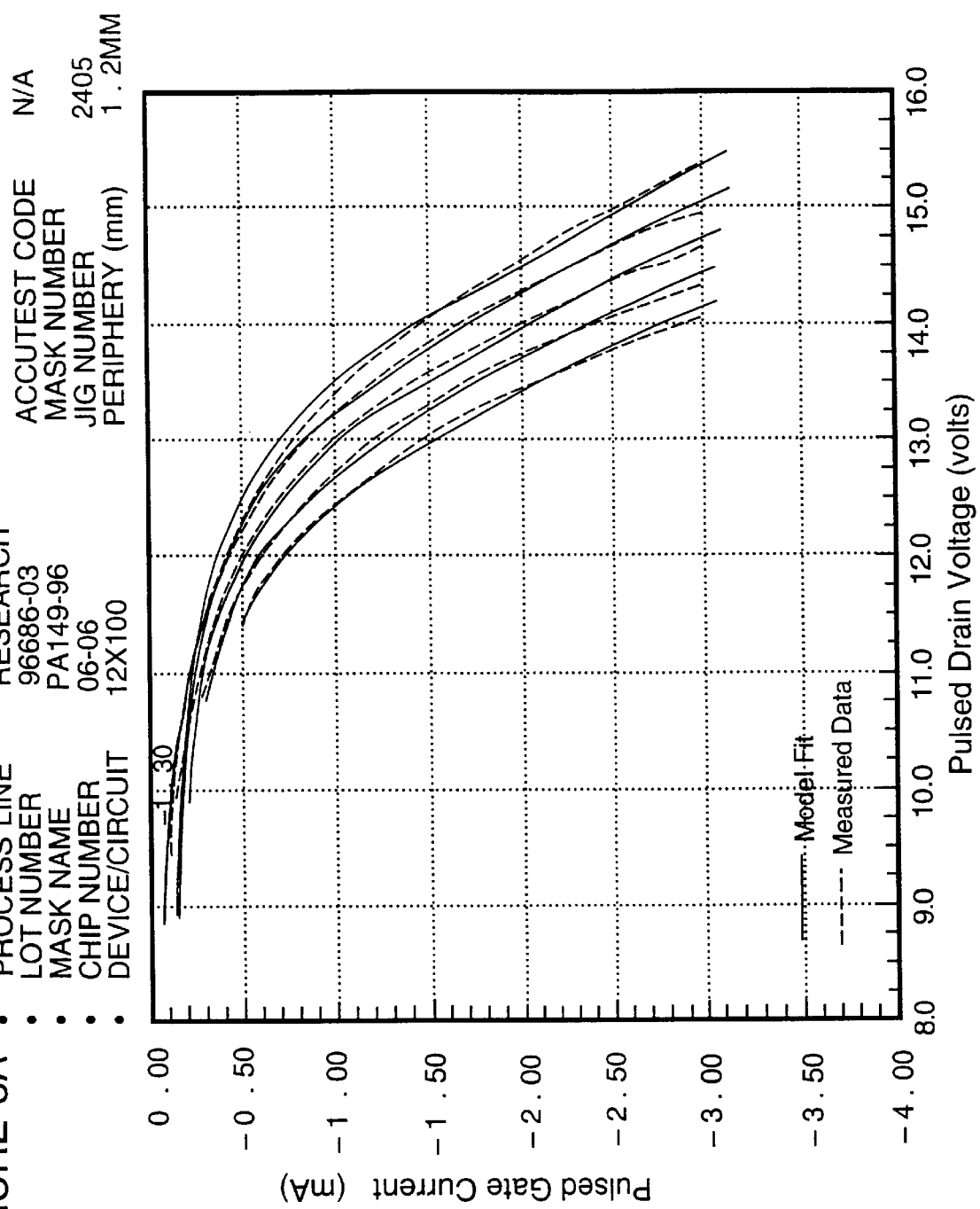
FIG. 8A is a plot of gate current vs. drain voltage.

The gate-drain reverse breakdown current is:

$$I_{br} = -\left(\frac{G_{\max}}{4}\right) \cdot [\tanh\{K_1 \cdot (V_{gs} - K_2)\} - 1] \cdot \left[(V_{gd} - V_{br}) - \sqrt{(V_{gd} - V_{br})^2 + K_3}\right]$$

with $G_{max}$, $K_1$, $K_2$, and $K_3$ being the fitting parameters, which are obtained by fitting to measured data as shown in FIGS. 8A–8B, and $V_{br}$ being the gate-drain breakdown voltage.

The remaining values are $Q_{gs}$ and $Q_{dg}$. It should be noted that the gate charge $Q_g$ is a function of both $V_{gs}$ and $V_{gd}$. The expression for the gate charge $Q_g$ is:

$$Q_g = \left[\frac{(C_{110} - C_{11th})}{2}f(V_{j1}) + C_{11th}(V_{j1} - V_{cgs})\right][1 + \lambda(V_0 - V_{ds0})] - C_{12sat}V_{j2}$$

where: $C_{110}$, $C_{11th}$, $V_{cgs}$, $\lambda$, $V_{ds0}$ and $C_{12sat}$ are gate charge fitting parameters;

$f(V_{j1})=V_{j1}-V_{cgs}+(1/A_{cgs})\ln(\cosh(A_{cgs}*(V_{j1}-V_{cgs})));$ $V_{j1}=\gamma_2*((1+\alpha)*V_{gs}-V_{ds}+\beta(V_{ds}^2+\delta_{ds}^2)^{0.5});$ $V_{j2}=\gamma_2*((1+\alpha)*V_{gs}-V_{ds}+\beta(V_{ds}^2+\delta_{ds}^2)^{0.5});$ $V_0=(V_{ds}^2+\delta_{ds}^2)^{0.5});$ and $A_{cgs}$, $\gamma_2$, $\alpha$, $\beta$, and $\delta_{ds}$ are gate charge fitting parameters. Further, it should be noted that:

$C_{gs}=\delta Q_g/\delta V_{gs}$, where $C_{gs}$ is obtained from the small signal model in FIG. 3, and $C_{dg}=\delta Q_g/\delta V_{gd}$, where $C_{dg}$ is obtained from the small signal model in FIG. 3. The plots for $C_{gs}$ and $C_{dg}$ can be obtained, e.g., from a file supplied by a user of the computer system 20 through a floppy disk. This file can contain the measured s-parameters from which $C_{gs}$ and $C_{dg}$ can be extracted.

Further:

$C_{gs}=\delta Q_g/\delta V_{gs}=C_1*(1+\lambda*(V_0-V_{ds0}))*\gamma_2*(\alpha+\beta*i\ V_{ds}/V_0)+C_2*\lambda*V_{ds}/V_0-\gamma_2*C_{12sat}*(\alpha-\beta*V_{ds}/V_0);$ $C_{dg}=\delta Q_g/\delta V_{gd}=C_1*(1+\lambda*(V_0-V_{ds0}))*\gamma_2*(1-\beta*V_{ds}/V_0)-C_2*\lambda*V_{ds}/V_0-\gamma_2*C_{12sat}*(1+\beta*V_{ds}/V_0);$ where:

$C_1=((C_{110}-C_{11th})/2)*(1+\tanh(A_{cgs}*(V_{j1}-V_{cgs})))+C_{11th}$ $C_2=((C_{110}-C_{11th})/2)*f(V_{j1})+C_{11th}*(V_{j1}-V_{cgs}).$ The fitting parameters are obtained by simultaneously fitting a family of $C_{gs}$ vs. $V_{gs}$, $V_{ds}$ and $C_{dg}$ vs. $V_{gs}$, $V_{ds}$ curves (shown in FIGS. 9A and 9B) extracted from small signal measured S—parameter data described earlier. To assist in the curve fitting operation, the user can supply initial estimated values for the fitting parameters. The closer the initial estimated values are to the actual values, the faster the curve fitting will converge to the values providing the best fit. The gate charge equations include improved smoothing functions Vj1 and Vj2.

Thus, by curve fitting for $C_{gs}$ and $C_{dg}$, $Q_g$ can be determined. Consequently $Q_{gs}$ and $Q_{gd}$ can be determined because by definition the gate charge $Q_g$ is divided as:

$Q_g=Q_{gs}+Q_{gd}.$

The equations for these two charges are as follows:

$Q_{gs}=(Q_g+C_{12sat}(V_{gs}-V_{ds}))f_1-C_{12sat}V_{gs}f_2$ $Q_{gd}=(Q_g+C_{12sat}V_{gs})f_2-C_{12sat}(V_{gs}-V_{ds})f_1$ with $f_1=0.5*(1+\tanh((3/\delta_{ds})*V_{ds}))$ $f_2=0.5*(1-\tanh((3/\delta_{ds})*V_{ds}))$ All parameters used in the charges $Q_{gs}$ and $Q_{gd}$ have been defined earlier.

With the large signal parameters established, the large signal model 10 can be used at step 50 to simulate the operation of the transistor. Computer software, e.g., written in C programming language, for simulating the operation of the transistor using the model 10 can be installed as a user defined model in a circuit simulator, such as Hewlett Packard/EESOF—Libra 6.0. The model 10 can be applied to MMIC amplifier design in the microwave and mm-wave frequency range. The symmetric nature of the gate charge function makes the model 10 applicable also to design of mixers.

EXAMPLES

Figure 9A:
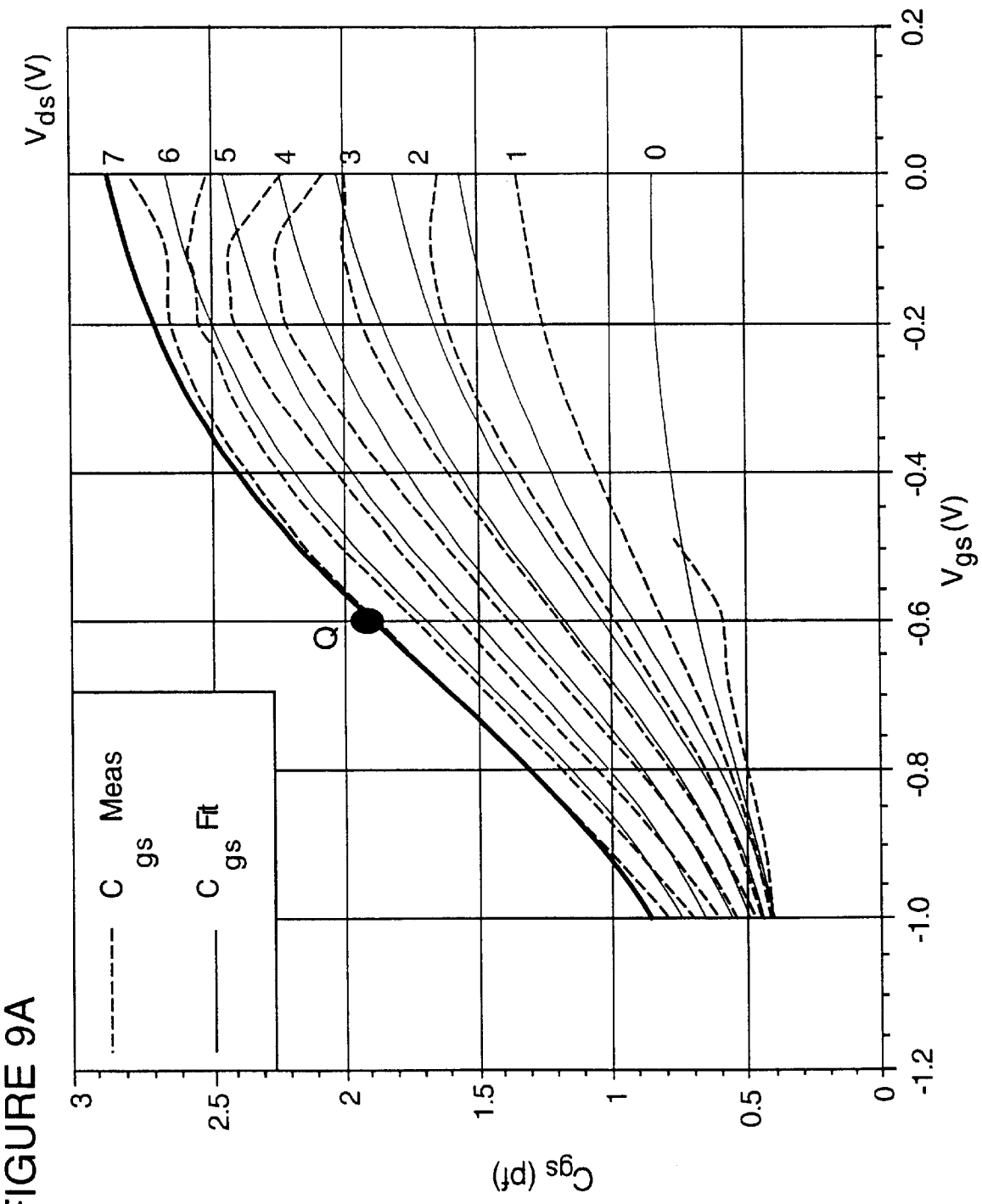
FIG. 9A is a plot of gate-source capacitance vs. gate-source voltage and drain-source voltage.
Figure 9B:
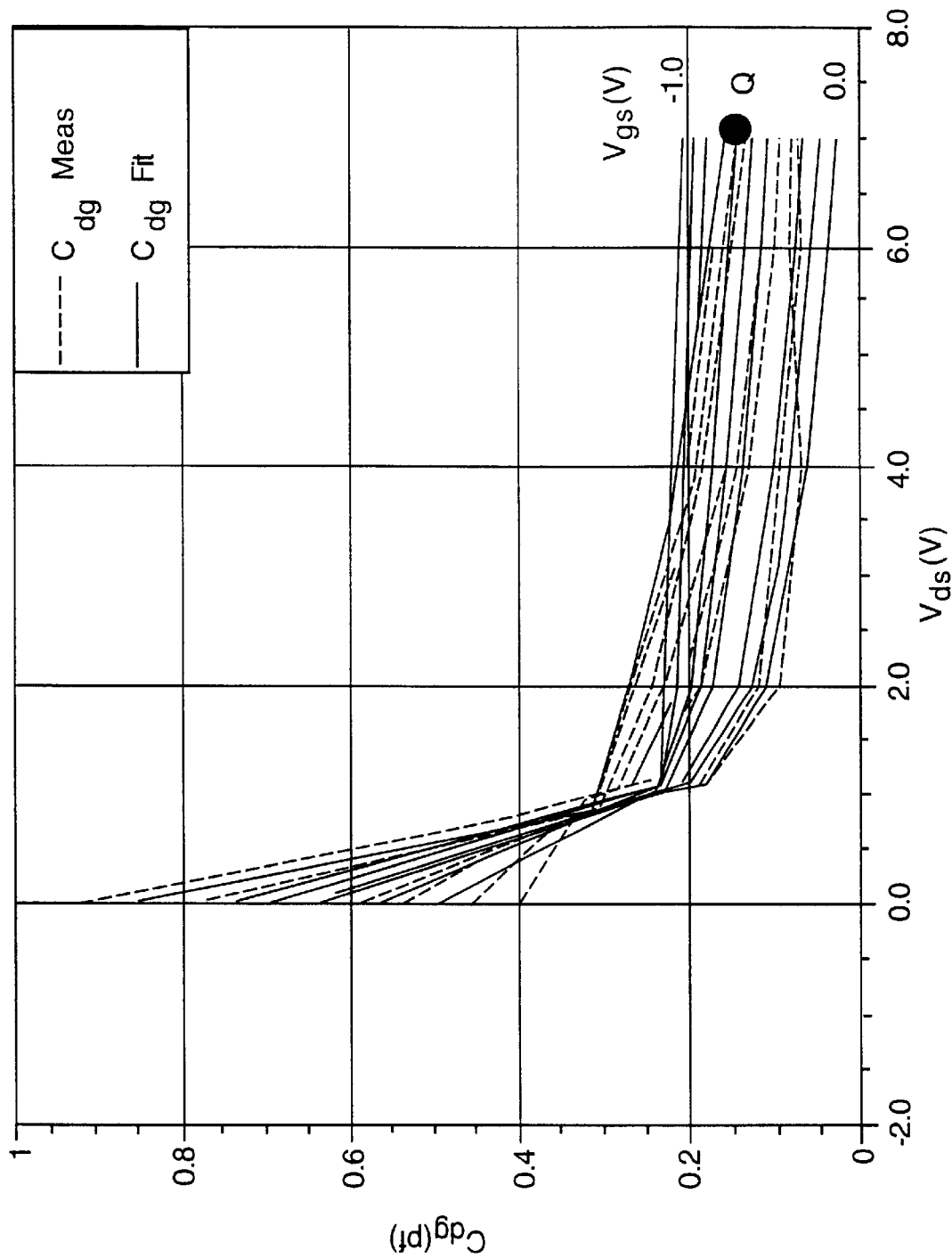
FIG. 9B is a plot of drain-gate capacitance vs. gate-source voltage and drain-source voltage.

Model 10 was compared against two other large signal FET models. Thus, three models with different gate charge expressions were compared. In the simplest gate charge formulation, $C_{gs}$ and $C_{dg}$ are held fixed at the operating point. In the second formulation, the capacitance parameters are derived by fitting a single $C_{gs}$ vs. $V_{gs}$ curve for the operating $V_{ds}$ (FIG. 9A) with $C_{dg}$ fixed to the value at the quiescent bias point (FIG. 9B). In the third, the model 10, shown in FIG. 2 and described above, is used. As will become evident below, model 10 uses the most complex but proper formulation of the gate charge. Parameters are obtained by simultaneously optimizing the fits to a family of $C_{gs}$ and $C_{dg}$ curves as a function of $V_{gs}$ and $V_{ds}$ (FIGS. 9A and 9B). All three models use identical I-V expressions, forward gate current expressions, and gate-drain breakdown expressions. The only difference between the models was the gate charge equation.

The I-V equation as noted above for model 10 shown in FIG. 2, was a modified form of the Materka equation (described in "Computer Calculation of Large-Signal GaAs FET Amplifier Characteristics", by A. Materka and T. Kacprzak, IEEE Trans. MTT- 33, pp. 129, 1985) and is defined as follows:

$$I_{ds} = I_{dss}\left[1-\left\{\frac{V_{gs}}{(V_{po}+\gamma V_{ds})}\right\}\right]^{(E+K_eV_{gs})} \cdot \tanh\left[\frac{(S_l \cdot V_{ds})}{\{I_{dss}(1-K_gV_{gs})\}}\right] \cdot \left[1+\frac{(S_sV_{ds})}{I_{dss}}\right]$$

with $I_{dss}$, $V_{po}$, $\gamma$, E, $K_e$, $S_1$, $S_s$, and $K_g$ being the fitting parameters. This equation is thus a "Modified Materka" equation.

The forward gate current was expressed as $$I_{gs}=I_{g0}\cdot\exp(\alpha_g\cdot V_{gs}-1)$$

in which $I_{g0}$ and $\alpha_g$ are fitting parameters.

The gate—drain reverse breakdown current was expressed as:

$$I_{br} = -\left(\frac{G_{max}}{4}\right) \cdot [\tanh\{K_1 \cdot (V_{gs}-K_2)\}-1] \cdot \left[(V_{gd}-V_{br})-\sqrt{(V_{gd}-V_{br})^2+K_3}\right]$$

with $G_{max}$, $K_1$, $K_2$, and $K_3$ being the fitting parameters.

The difference between the formulations used in the three models is explained in the TABLE below:

TABLE

| EQUATIONS | MODEL A | MODEL B | MODEL 10 (FIG. 2) |
|---|---|---|---|
| Gate Charge Model | $C_{gs}$ = constant | $C_{gs} = f(V_{gs})$ | $C_{gs} = f(V_{gs}, V_{ds})$ |
| I-V Expression | "Modified Materka" | "Modified Materka" | "Modified Materka" |
| Gate Charge Expressions | $Q_g = f_1(V_{gs}) + f_2(V_{gd})$ | $Q_g = f_1(V_{gs}) + f_2(V_{gd})$ | $Q_g = f(V_{gs}, V_{gd})$ |
|  | $Q_g = Q_{gs} + Q_{gd}$ | $Q_g = Q_{gs} + Q_{gd}$ | $Q_g = Q_{gs} + Q_{gd}$ |

TABLE-continued

| EQUATIONS | MODEL A | MODEL B | MODEL 10 (FIG. 2) |
|---|---|---|---|
| | $Q_{gs} = C_{gg}*V_{gs}$ | $Q_{gs} = f(V_{gs})$ | $Q_{gs} = f(V_{gs}, V_{gd})$ |
| | $Q_{gd} = C_{dg}*V_{gd}$ | $Q_{gd} = C_{dg}*V_{gd}$ | $Q_{gd} = f(V_{gs}, V_{gd})$ | where Y=f(x) indicates that a Y is a function of x. The use of f() in multiple places in the TABLE does not mean that the indicated quantities are related by the same function in each instance.

The expressions for $Q_g$, used in the three gate charge models are as follows:

MODEL A $$Q_g = C_{gs} \cdot V_{gs} + C_{dg} \cdot V_{gd}$$

where $C_{gs}$ and $C_{dg}$ are constants equal to their respective values at the small signal quiescent bias point.

MODEL B $$Q_g = \left[\left\{\frac{(C_{gs0} - C_{dg})}{2.0} \cdot A_{cgs}\right\} \cdot \ln[\cosh\{A_{cgs} \cdot (V_{gs} - V_{cgs})\}] - \ln[\cosh(-A_{cgs} \cdot V_{cgs})] + 0.5 V_{gs} \cdot (C_{gs0} + C_{dg}) + V_{gd} \cdot C_{dg}\right.$$

where $C_{gs0}$, $A_{cgs}$, $V_{cgs}$ are fitting constants and $C_{dg}$ is a constant equal to its value at the small signal quiescent bias point.

MODEL 10 (FIG. 2)

Two terminal voltage dependent gate charge formulations were developed by Statz et al. and described in "GaAs FET Device and Circuit Simulation in SPICE", by H. Statz, P. Newman, I. W. Smith, R. A. Pucel and H. A. Haus, IEEE Trans.ED-34, pp. 160, 1987 for GaAs FETs for circuit simulation in SPICE and further refined by Root et al. as described in "Principles of Nonlinear Active Device Modeling for Circuit Simulation" by D. E. Root and B. Hughes, 32nd ARFTG Conference. Those expressions have been further modified in this work to fit power PHEMT devices. Thus, for the most accurate and correct formulation, [$C_{gs}$=f($V_{gs}$, $V_{ds}$) and $C_{dg}$=f($V_{gs}$, $V_{ds}$)], the gate charge expression for $Q_g$ outlined in the previous section has been used.

The large signal model 10 (FIG. 2) resulting from this gate charge formulation is consistent with a previously developed small signal model described in "A New Small-Signal MESFET and HEMT Model Compatible with Large-Signal Modeling" by W. Struble, A Platzker, S. Nash and J. Pla in IEEE MTT-S Digest. pp. 1567, 1994.

Experimental Results and Model Verification

Figure 10A:
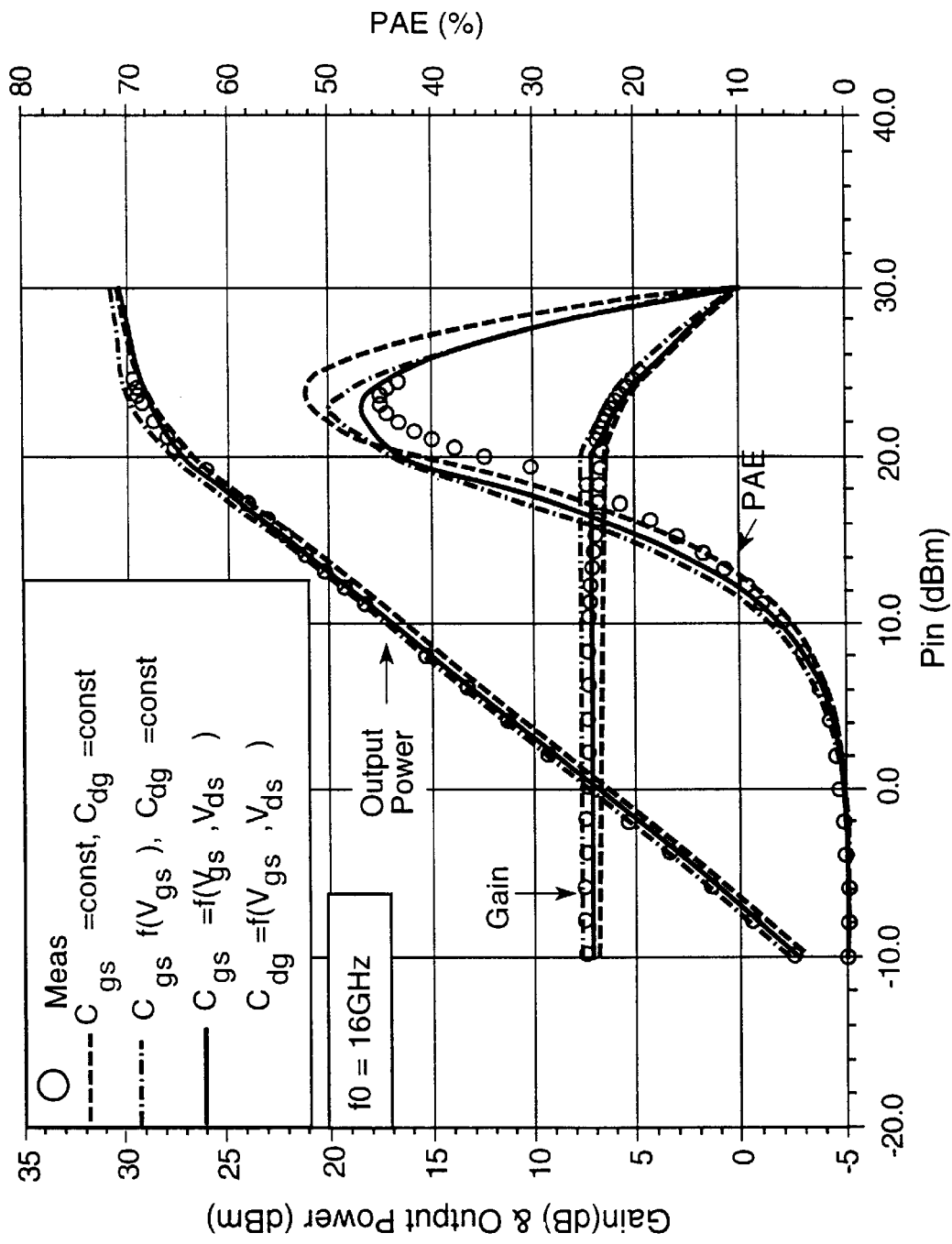
FIGS. 10A–10B are plots of gain, output power, and PAE vs. input power.
Figure 10B:
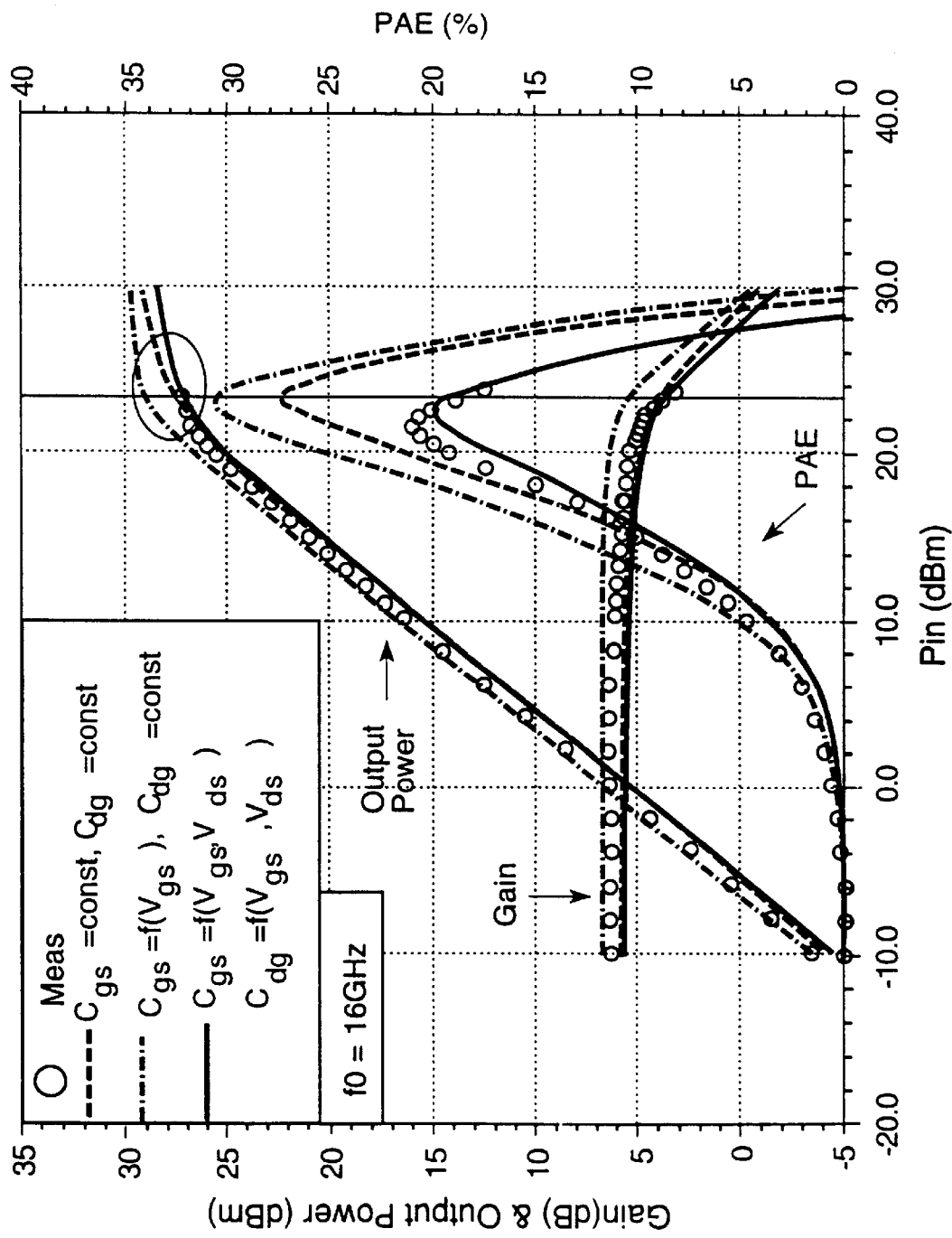
Figure 10C:
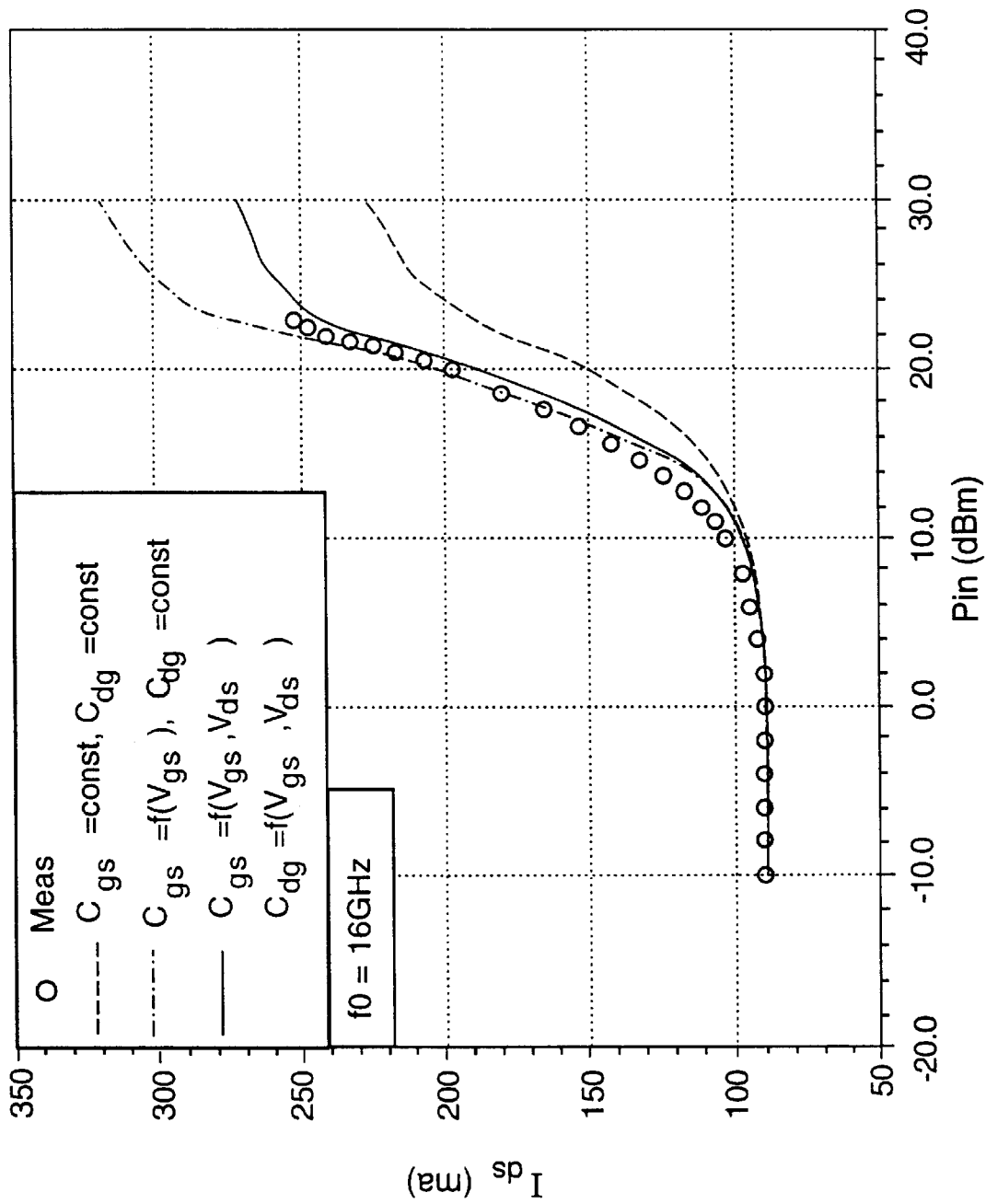
FIG. 10C is a plot of drain-source current vs. input power.

Device level simulations on a 0.25 m, 1.2 mm power PHEMT using the three models were compared against measured power data from an automated load pull system at 2, 8, and 16 GHz for a class AB bias ($V_{ds}$=7V, $I_{ds}$=100 ma). Single tone fundamental power results at 16 GHz are shown in FIGS. 10A, 10B and 10C, for two output load conditions: peak power ($\Gamma_s$, the source reflection coefficient, having a magnitude of 0.77 and a phase of −160 degrees, $\Gamma_1$, the load reflection coefficient, having a magnitude of 0.65 and a phase of 176 degrees) and a non-optimum case ($\Gamma_s$ having a magnitude of 0.77 and a phase of −160 degrees, $\Gamma_1$ having a magnitude of 0.33 and a phase of −163 degrees). For the peak power case, all three models give a reasonably accurate prediction of the output power, while the model (Model 10, FIG. 2) with the two terminal voltage dependent gate charge formulation ($C_{gs}$=f($V_{gs}$, $V_{ds}$) and $C_{dg}$=f($V_{gs}$, $V_{ds}$)) tracks the PAE with input drive more accurately. For the non-optimum load case (typically found in wideband power amplifier interstage design), the two terminal voltage dependent gate charge model (Model 10) predicts the output power, PAE and drain current accurately, while the other two models tend to overpredict on the saturated power and PAE, and either underpredict or overpredict on the drain current. Overprediction of output power may cause designers to be overly optimistic about the performance of multi-stage, wideband power amplifiers, resulting in additional design iterations.

Figure 11A:
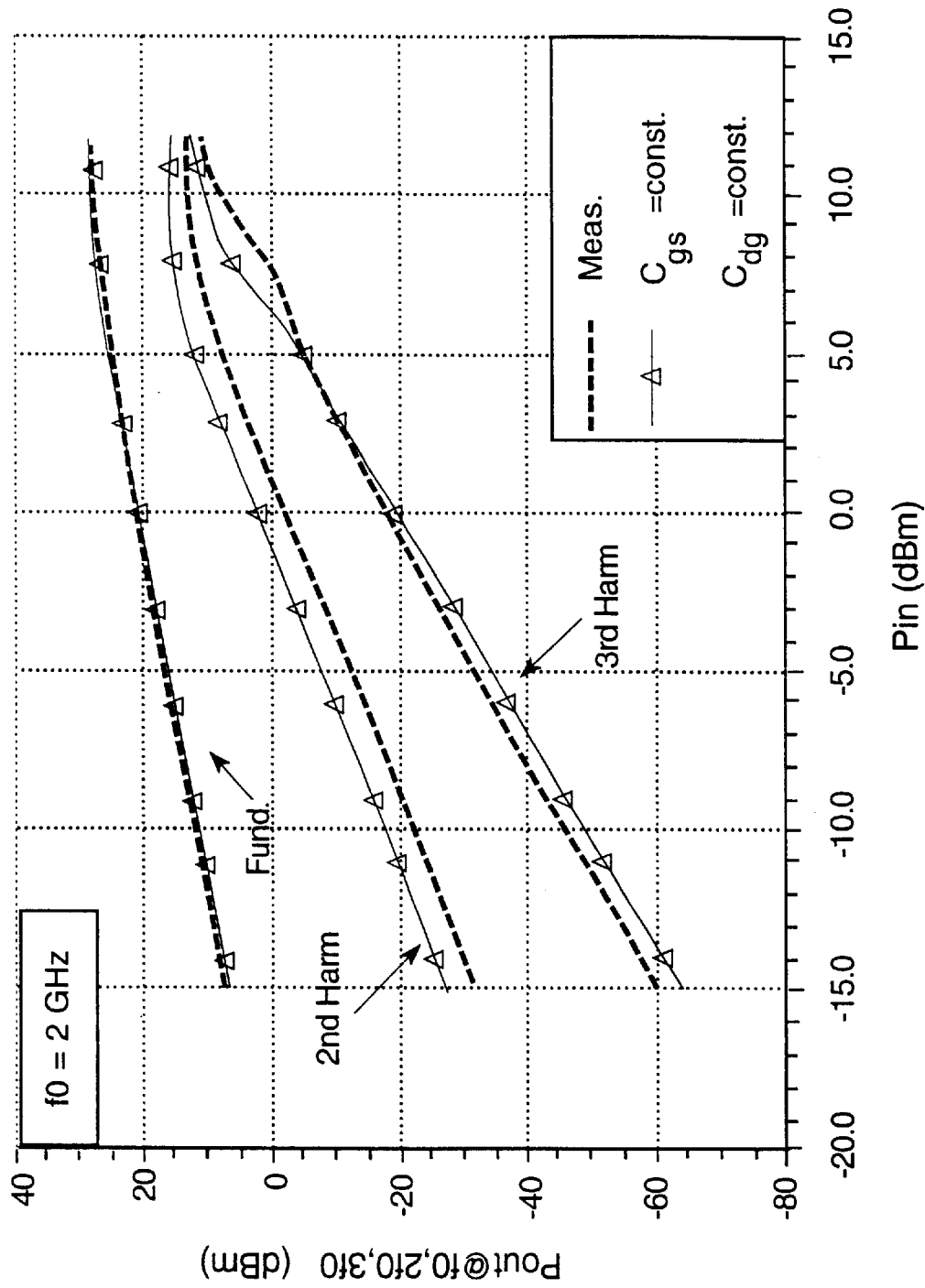
FIGS. 11A–11C are plots of output power vs. input power for various transistor models.
Figure 11B:
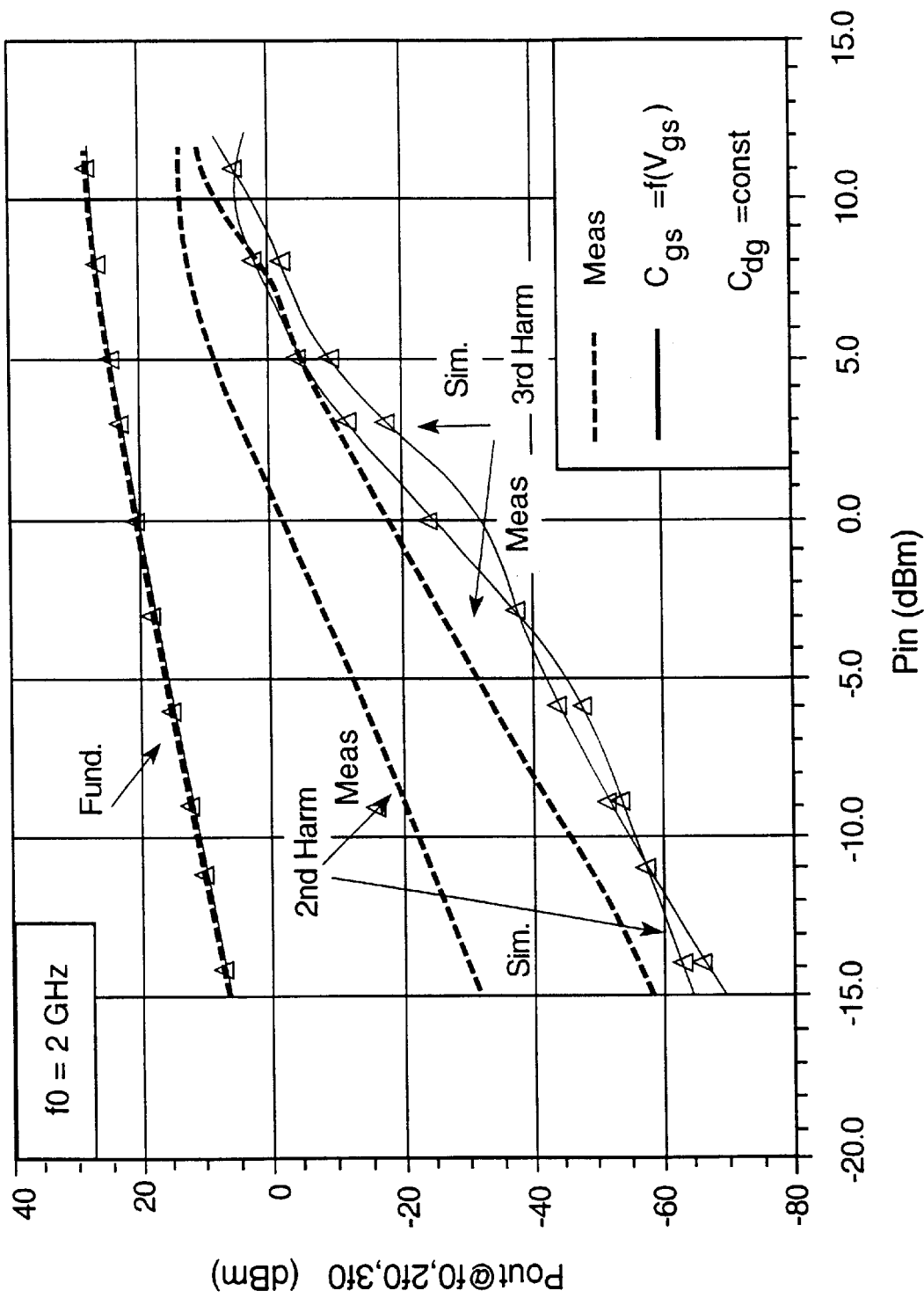
Figure 11C:
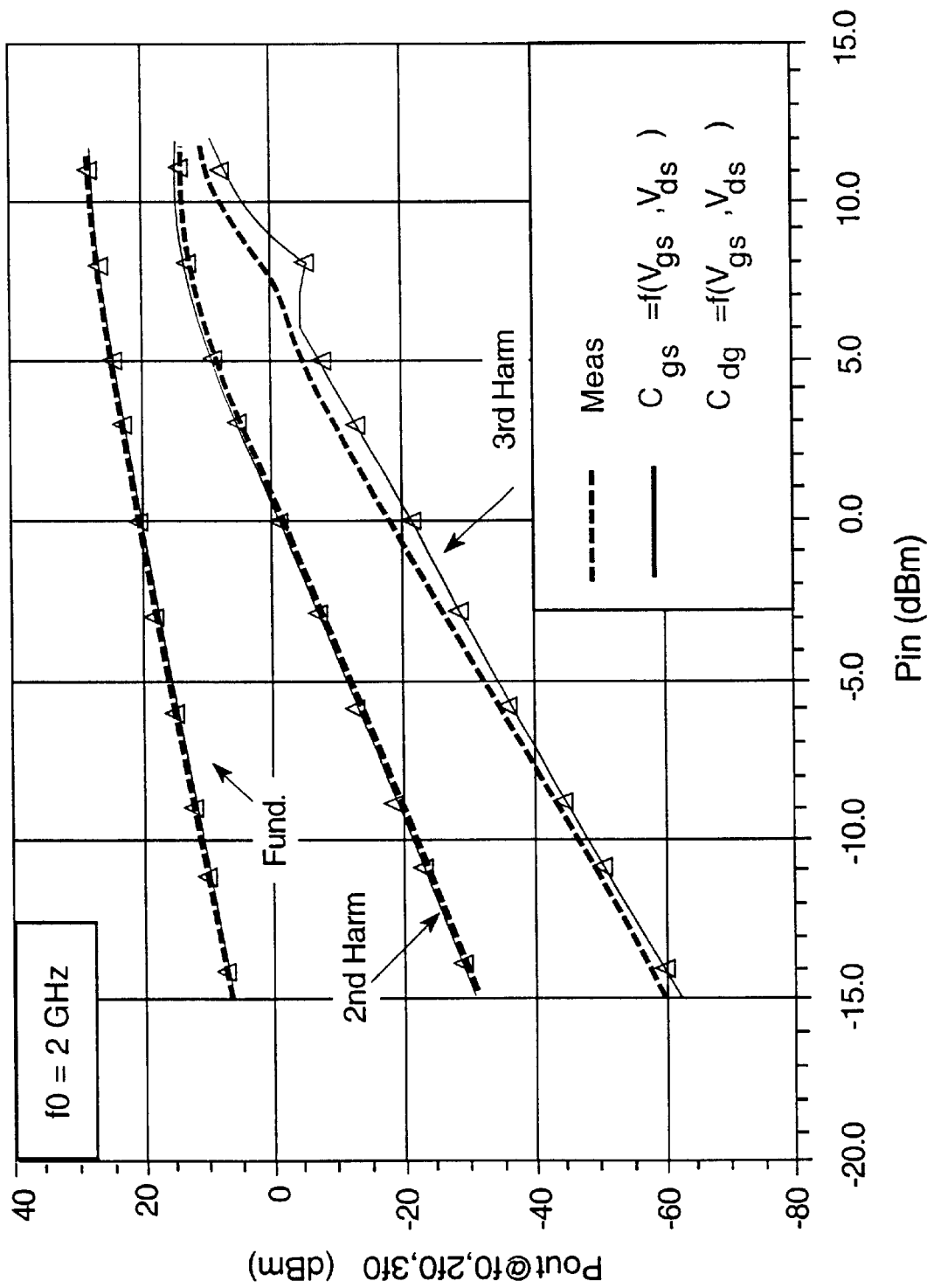

Accurate modeling of the device capacitance non-linearities is even more important in predicting the harmonic power and third order IMD. This becomes more apparent as the operating frequency is increased from S-band to X-band and into the mm-wave region. Measurements and simulations with the three models for harmonic power with a single tone fundamental power input at 2 GHz, are shown in FIGS. 11A, 11B and 11C. Once again, it is apparent that proper modeling of the gate charge ($C_{gs}$=f($V_{gs}$, $V_{ds}$) and $C_{dg}$=f($V_{gs}$, $V_{ds}$)) (Model 10, FIG. 2), gives the most accurate prediction of the 2nd and 3rd harmonic output power. The model with $C_{gs}$=f($V_{gs}$) and $C_{dg}$=constant (Model B), gives inaccurate results while the simplest model ($C_{gs}$=constant, $C_{dg}$=constant) gives a fair prediction of the harmonic power, primarily because the device capacitance effects are less significant at 2 GHz.

Figure 12A:
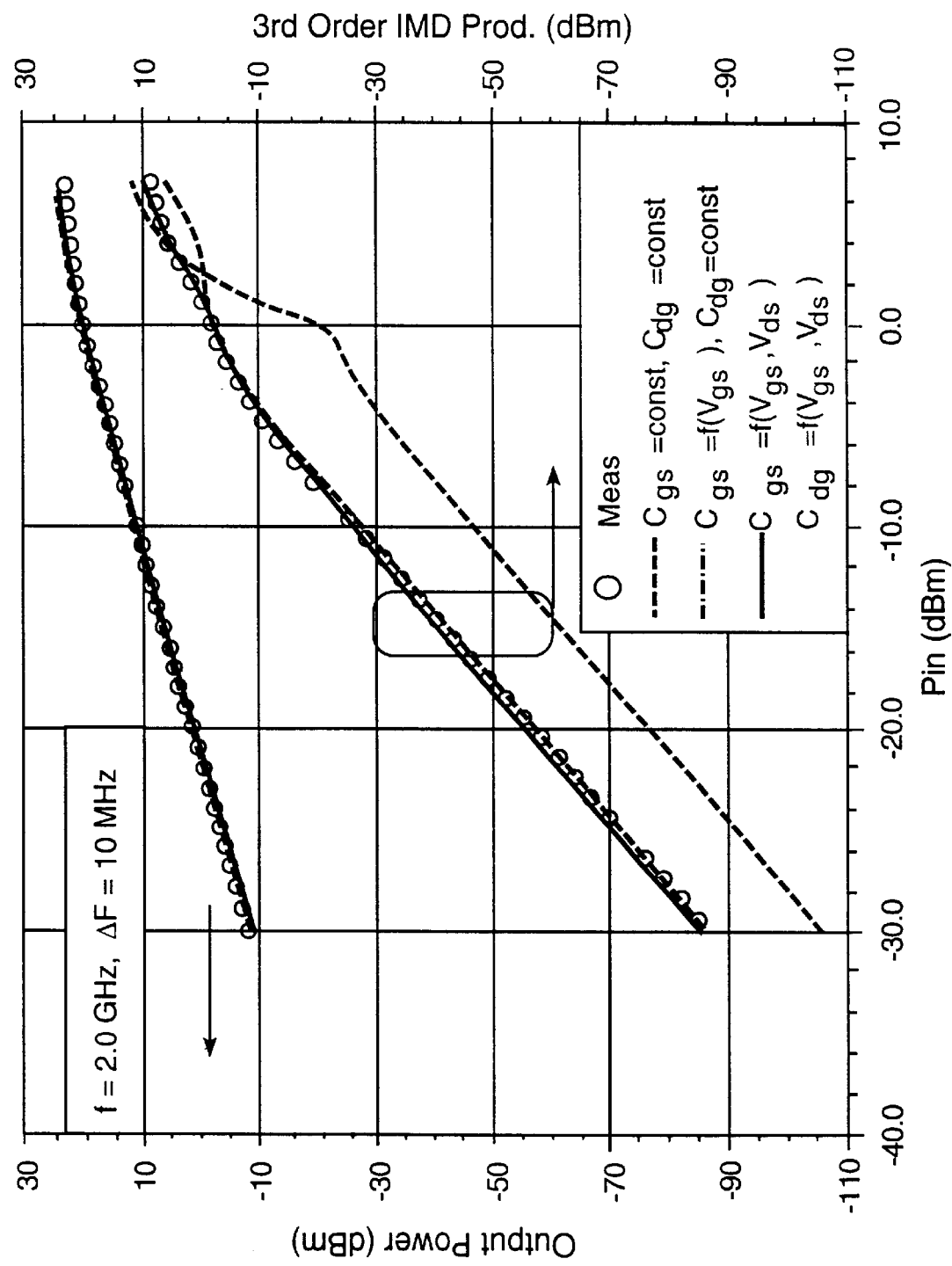
FIG. 12A is a plot of output power and IMD vs. input power at 2.0 GHz.
Figure 12B:
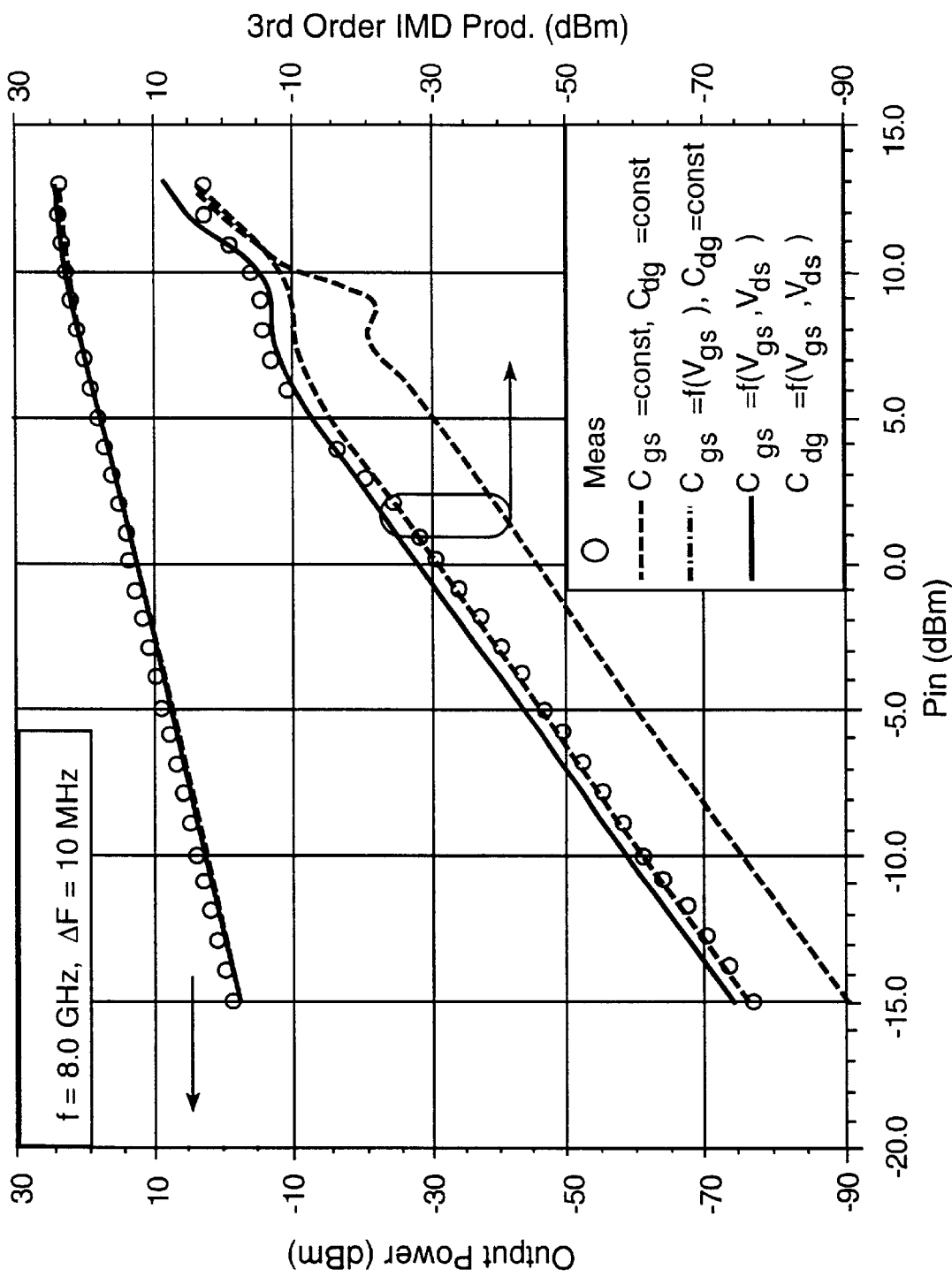
FIG. 12B is a plot of output power and IMD vs. input power at 8.0 GHz.

However, the capacitance formulations are most significant when predicting 3rd order IMD products. Results are shown in FIGS. 12A, 12B at two frequencies 2 and 8 GHz. The simplest model gives erroneous results at both frequencies. The other two models track the 3rd order IMD products with the two terminal voltage dependent gate charge model (Model 10, FIG. 2) providing a more accurate prediction in the saturation region. Only Model 10 (FIG. 2), ($C_{gs}$=f($V_{gs}$, $V_{ds}$) and $C_{dg}$=f($V_{gs}$, $V_{ds}$)), accurately predicts fundamental power, harmonic power and 3rd order products.

Figure 13:
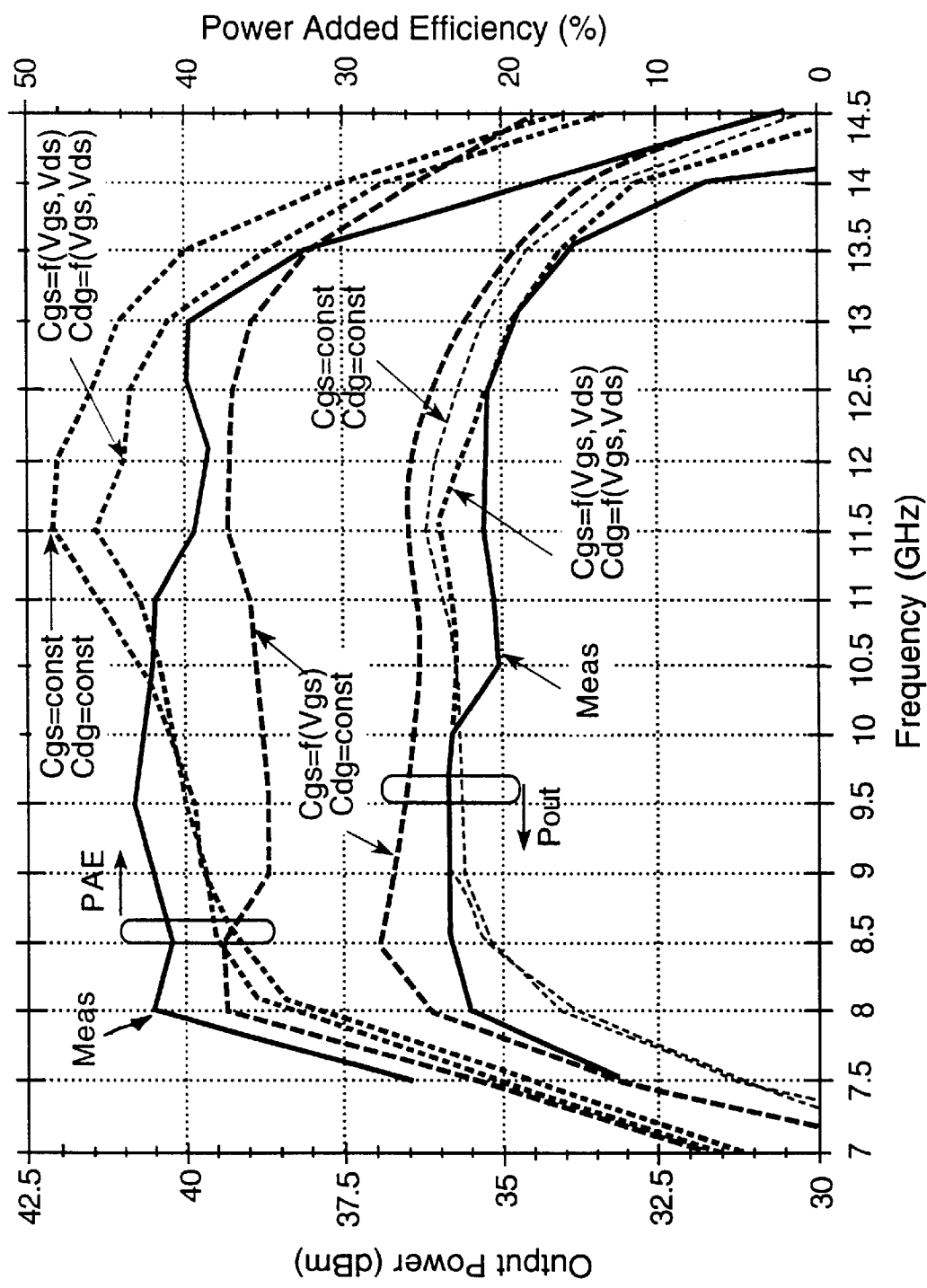
FIG. 13 is a plot of output power and PAE vs. frequency.

Finally, results are presented (FIG. 13) for a 2-stage power amplifier designed for the band 8 to 13 GHz, and compared against the three models. The results show that the two terminal voltage dependent gate charge model ($C_{gs}$=f($V_{gs}$, $V_{ds}$) and $C_{dg}$=f($V_{gs}$, $V_{ds}$), Model 10, FIG. 2) gives the best prediction of the amplifier performance. One of the simpler formulations with $C_{gs}$=f($V_{gs}$) and $C_{dg}$=constant, overpredicts on the power and underpredicts on PAE. The simplest model with $C_{gs}$=constant and $C_{dg}$=constant overpredicts on the power and PAE at the high end of the band.

Thus, from the above, it may be concluded that the two terminal voltage dependent gate charge model (Model 10, FIG. 2) with $C_{gs}$=f($V_{gs}$, $V_{ds}$) and $C_{dg}$=f($V_{gs}$, $V_{ds}$), provides the best prediction of all the parameters measured, namely: Output power, PAE, drain current, harmonic power and 3rd order IMD. Previous simplistic formulations for the PHEMT gate charge, although adequate at low frequencies, lead to inaccuracies at higher frequencies.

Other embodiments are within the spirit and scope of the appended claims.

What is claimed is:

1. A method for determining large signal model values for a transistor, the method comprising:

obtaining device parameters of the transistor;

using the obtained device parameters to establish small signal model parameters in accordance with a small signal model of the transistor, such parameters including a gate-source capacitance $C_{gs}$ and a gate-drain capacitance $C_{dg}$;

applying curve fitting to $C_{gs}$ and $C_{dg}$ to establish large signal gate charge fitting parameters;

using the established large signal gate charge fitting parameters to establish a gate-source charge $Q_{gs}$ and a gate-drain charge $Q_{gd}$ as large signal model values for the transistor.

2. The method recited in claim 1 wherein $C_{gs}$ and a drain-gate capacitance $C_{dg}$ are functions of a gate-source voltage $V_{gs}$ and a drain-source voltage $V_{ds}$.

3. The method recited in claim 2 wherein $Q_{gs}$ and $Q_{gd}$ are functions of $V_{gs}$ and a gate-drain voltage $V_{gd}$.

4. The method recited in claim 1 wherein $$Q_g = Q_{gs} + Q_{gd},$$
$$C_{gs} = \delta Q_g / \delta V_{gs}, \text{ and}$$
$$C_{dg} = \delta Q_g / \delta V_{gd}$$

wherein $Q_g$ is a gate charge.

5. The method recited in claim 4 wherein $$Q_g = \left[ \frac{(C_{110} - C_{11th})}{2} f(V_{j1}) + C_{11th}(V_{j1} - V_{cgs}) \right] [1 + \lambda(V_0 - V_{ds0})] - C_{12sat} V_{j2}$$

where: $C_{110}$, $C_{11th}$, $V_{cgs}$, $\lambda$, $V_{ds0}$ and $C_{12sat}$ are gate charge fitting parameters;

$$f(V_{j1}) = V_{j1} - V_{cgs} + (1/A_{cgs}) \ln(\cosh(A_{cgs} * (V_{j1} - V_{cgs})));$$
$$V_{j1} = \gamma_2 * ((1+\alpha) * V_{gs} - V_{ds} + \beta(V_{ds}^2 30 \; \delta_{ds}^2)^{0.5});$$
$$V_{j2} = \gamma_2 * ((1+\alpha) * V_{gs} - V_{ds} - \beta(V_{ds}^2 + \delta_{ds}^2)^{0.5});$$
$$V_0 = (V_{ds}^2 + \delta_{ds}^2)^{0.5});$$

and $A_{cgs}$, $\gamma_2$, $\alpha$, $\beta$, and $\delta_{ds}$ are gate charge fitting parameters; wherein $$C_{gs} = \delta Q_g / \delta V_{gs} = C_1 * (1 + \lambda * (V_0 - V_{ds0})) * \gamma_2 * (\alpha + \beta * V_{ds} / V_0) + C_2 * \lambda * V_{ds} / V_0 - \gamma_2 * C_{12sat} * (\alpha - \beta * V_{ds} / V_0);$$

$$C_{dg} = \delta Q_g / \delta V_{gd} = C_1 * (1 + \lambda * (V_0 - V_{ds0})) * \gamma_2 * (1 - \beta * V_{ds} / V_0) - C_2 * \lambda * V_{ds} / V_0 - \gamma_2 * C_{12sat} * (1 + \beta * V_{ds} / V_0); \text{ and}$$

wherein $$C_1 = ((C_{110} - C_{11th}) / 2) * (1 + \tanh(A_{cgs} * (V_{j1} - V_{cgs}))) + C_{11th}$$
$$C_2 = ((C_{110} - C_{11th}) / 2) * f(V_{j1}) + C_{11th} * (V_{j1} - V_{cgs}).$$

6. The method recited in claim 5 wherein the gate-source charge and the gate-drain charge are given by:

$$Q_{gs} = (Q_g + C_{12sat}(V_{gs} - V_{ds})) f_1 - C_{12sat} V_{gs} f_2$$
$$Q_{gd} = (Q_g + C_{12sat} V_{gs}) f_2 - C_{12sat} (V_{gs} - V_{ds}) f_1; \text{ and}$$

wherein $$f_1 = 0.5 * (1 + \tanh((3/\delta_{ds}) * V_{ds}))$$
$$f_2 = 0.5 * (1 - \tanh((3/\delta_{ds}) * V_{ds})).$$

7. The method recited in claim 1 wherein the device parameters are s-parameters.

8. The method recited in claim 1 wherein curve fitting is applied simultaneously to a family of curves for each of $C_{gs}$ and $C_{dg}$.

9. A method for determining a large signal model for a transistor, the method comprising:

establishing a small signal model for a transistor, such model having a gate-source capacitance $C_{gs}$ and a drain-gate capacitance $C_{dg}$, both being functions of a gate-source voltage $V_{gs}$ and a drain-source voltage $V_{ds}$;

measuring s-parameters of the transistor;

applying curve fitting to the measured s-parameters to establish small signal model parameters, such parameters including gate-source capacitance $C_{gs}$ as a function of $V_{gs}$ and $V_{ds}$ and gate-drain capacitance $C_{dg}$ as a function of $V_{gs}$ and $V_{ds}$;

applying curve fitting to $C_{gs}$ and $C_{dg}$ to establish large signal gate charge fitting parameters;

using the established large signal gate charge fitting parameters to express a gate-source charge $Q_{gs}$ and a gate-drain charge $Q_{gd}$ as functions of $V_{gs}$ and a gate-drain voltage $V_{gd}$ in a large signal model for the transistor.

10. The method recited in claim 9 wherein the transistor is a field effect transistor.

11. The method recited in claim 10 wherein the transistor is a PHEMT.

12. A computer program product, residing on a computer readable medium, comprising instructions for causing a computer to:

measure the s-parameters of a transistor;

determine small signal device parameters in accordance with a small signal model by curve fitting the measured s-parameters, one of such small signal parameters being a gate-source capacitance $C_{gs}$ which is a function of a gate-source voltage $V_{gs}$ and a drain-source voltage $V_{ds}$, another one of such small signal parameters being a drain-gate capacitance $C_{ds}$ which is a function of $V_{gs}$ and $V_{ds}$;

determine gate charge fitting parameters, in accordance with a curve fitting operation, from $C_{gs}$ and $C_{ds}$ to establish a large signal gate-source charge $Q_{gs}$ and a large signal gate-drain charge $Q_{gd}$.

13. The computer program product recited in claim 12 further comprising instructions for causing the computer to use $Q_{gs}$ and $Q_{gd}$ to model large signal operation of the transistor.

14. A computer program product, residing on a computer readable medium, comprising instructions for causing a computer to:

obtain device parameters of the transistor;

use the obtained device parameters to establish small signal model parameters in accordance with a small signal model of the transistor, such parameters including a gate-source capacitance $C_{gs}$ and a gate-drain capacitance $C_{dg}$;

apply curve fitting to $C_{gs}$ and $C_{dg}$ to establish large signal gate charge fitting parameters;

use the established large signal gate charge fitting parameters to establish a gate-source charge $Q_{gs}$ and a gate-drain charge $Q_{gd}$ as large signal model values for the transistor.

* * * * *

UNITED STATES PATENT AND TRADEMARK OFFICE
CERTIFICATE OF CORRECTION

PATENT NO.    : 6,266,629 B1
DATED         : July 24, 2001
INVENTOR(S)   : Mallavarpu et al.

It is certified that error appears in the above-identified patent and that said Letters Patent is hereby corrected as shown below:

Column 2,
Line 39, delete "$V_{ds}/V_0$—$C_2$" and replace with -- $V_{ds}/v_0$)- $C_2$ --.
Line 40, delete "$V_{0\gamma 2}$" and replace with -- $V_{0-\gamma 2}$ --.

Column 3,
Line 49, delete "is circuit" and replace with -- is a circuit --.
Line 58, delete "$I_{dg}$" and replace with -- $I_{ds}$ --.

Column 5,
Line 32, delete "is a extrinsic" and replace with -- is an extrinsic --.
Line 45, delete "voltage; and" and replace with -- voltage; --.
Line 46, delete "is drain" and replace with -- is the drain --.
Line 46, delete "conductance;" and replace with -- conductance; and --.
Line 47, delete "is drain" and replace with -- is the drain --.
Line 48, delete "is drain" and replace with -- is the drain --.
Line 49, delete "is a" and replace with -- is an --.
Line 50, delete "is a" and replace with -- is an --.
Line 51, delete "is a" and replace with -- is an --.
Line 52, delete "is source" and replace with -- is the source --.
Line 53, delete "is source" and replace with -- is the source --.
Line 66, delete "model are:" and replace with -- model: --.

Column 6,
Line 19, delete "Cgs" and replace with -- $C_{gs}$ --.
Line 20, delete "Cdg" and replace with -- $C_{dg}$ --.
Line 23, delete "Ids" and replace with -- $I_{ds}$ --.

Column 7,
Line 4, delete "-$V_{ds}$ +β" and replace with -- $V_{ds}$ -β --.
Line 5, delete ")$^{0.5}$)" and replace with -- )$^{.5}$ --.

Column 8,
Line 39, delete "as" and replace with -- as: --.

UNITED STATES PATENT AND TRADEMARK OFFICE
CERTIFICATE OF CORRECTION

PATENT NO. : 6,266,629 B1
DATED : July 24, 2001
INVENTOR(S) : Mallavarpu et al.

It is certified that error appears in the above-identified patent and that said Letters Patent is hereby corrected as shown below:

Column 9,
Line 25, delete "$\left[\left\{\frac{(C_{gs0} - C_{dg})}{2.0}\right.\right.$" and replace with -- $\left[\left\{\frac{C_{gs0} - C_{dg}}{2.0}\right\}\right.$ --.

Line 37, delete "Trans.ED" and replace with -- Trans. ED --.
Line 53, delete "Experimental Results and Model Verification" and replace with -- EXPERIMENTAL RESULTS AND MODEL VERIFICATION --.

Column 11,
Line 33, delete "($V_{ds}^2$30" and replace with -- ($V_{ds}^2$+ --.

Signed and Sealed this

First Day of October, 2002

Attest:

Attesting Officer

JAMES E. ROGAN
Director of the United States Patent and Trademark Office